(12) United States Patent
Asghari

(10) Patent No.: US 7,945,131 B1
(45) Date of Patent: May 17, 2011

(54) SYSTEM HAVING OPTICAL AMPLIFIER INCORPORATED INTO STACKED OPTICAL DEVICES

(75) Inventor: Mehdi Asghari, San Marino, CA (US)

(73) Assignee: Kotusa, Inc., Monterey Park, CA (US)

( * ) Notice: Subject to any disclaimer, the term of this patent is extended or adjusted under 35 U.S.C. 154(b) by 797 days.

(21) Appl. No.: 12/008,717

(22) Filed: Jan. 11, 2008

(51) Int. Cl.
*G02B 6/42* (2006.01)
*H01S 3/00* (2006.01)
*H01L 21/00* (2006.01)

(52) U.S. Cl. ........... 385/47; 385/14; 385/24; 385/36; 385/31; 385/129; 385/130; 385/131; 359/333; 438/29; 438/31

(58) Field of Classification Search ........... 385/14, 385/31, 40, 39, 129, 130, 131, 132, 47, 24, 385/36; 359/333, 342, 343, 344, 346, 347, 359/349; 438/29, 31
See application file for complete search history.

(56) References Cited

U.S. PATENT DOCUMENTS

| | | | |
|---|---|---|---|
| 4,693,545 A | * | 9/1987 | Henningsen et al. ........... 385/30 |
| 5,416,861 A | * | 5/1995 | Koh et al. ........... 385/14 |
| 5,881,190 A | | 3/1999 | Harpin |
| 5,991,484 A | | 11/1999 | Harpin |
| 6,096,566 A | | 8/2000 | MacPherson |
| 6,108,472 A | | 8/2000 | Rickman |
| 6,316,281 B1 | | 11/2001 | Lee |
| 6,343,171 B1 | * | 1/2002 | Yoshimura et al. ........... 385/50 |
| 6,766,072 B2 | * | 7/2004 | Marazzi et al. ........... 385/14 |
| 6,785,447 B2 | * | 8/2004 | Yoshimura et al. ........... 385/42 |

(Continued)

FOREIGN PATENT DOCUMENTS

WO  WO 00/10039  2/2000

OTHER PUBLICATIONS

Kuniharo Kato, *PLC Hybrid Integration Technology and Its Application to Photonic Components*, IEEE Journal of Selected Topics in Quantum Electronics, vol. 6, No. 1, Jan./Feb. 2000 (pp. 4-13).

(Continued)

*Primary Examiner* — Brian M Healy
(74) *Attorney, Agent, or Firm* — Gavrilovich, Dodd & Lindsey, LLP

(57) ABSTRACT

An optical system includes optical devices that each has functional sides between lateral sides. The functional sides include a top side and a bottom side. A first one of the devices has an optical amplifier, a first waveguide, and a first port. A second one of the devices has a second port optically aligned with a second waveguide. The second device is positioned over one of the functional sides of the first device. The optical amplifier is optically positioned between the first waveguide and the first port such that a light signal from the first waveguide enters the amplifier and travels through the amplifier. The first port is configured to receive the light signal from the optical amplifier and change the direction that the light signal is traveling such that the light signal exits the first device traveling in a direction that is toward the second device. The second port is configured to receive the light signal after the light signal exits the first device and to change a direction that the light signal is traveling such that the light signal enters the second waveguide.

29 Claims, 15 Drawing Sheets

U.S. PATENT DOCUMENTS

| | | |
|---|---|---|
| 7,391,937 B2 | 6/2008 | Thorson |
| 7,522,792 B2 * | 4/2009 | Sugita et al. .................... 385/50 |
| 7,561,765 B2 * | 7/2009 | Funabashi et al. .............. 385/14 |
| 2004/0184717 A1 | 9/2004 | Koontz |
| 2004/0202414 A1 | 10/2004 | Wong |
| 2004/0202422 A1 | 10/2004 | Gunn |
| 2005/0041906 A1 | 2/2005 | Sugama |
| 2006/0008199 A1 * | 1/2006 | Glebov et al. ................... 385/15 |
| 2006/0018588 A1 | 1/2006 | Uchida |
| 2006/0056756 A1 | 3/2006 | Uchida |
| 2006/0126995 A1 | 6/2006 | Glebov et al. |
| 2007/0160322 A1 | 7/2007 | Ide |
| 2007/0183720 A1 | 8/2007 | Ide et al. |
| 2010/0111468 A1 * | 5/2010 | Funabashi et al. .............. 385/14 |

OTHER PUBLICATIONS

Tim Bestwick, *A Silicon-Based Integration Optical Manufacturing Technology*, 1998 Electronic Components and Technology Conference (pp. 566-571).

* cited by examiner

SYSTEM HAVING OPTICAL AMPLIFIER INCORPORATED INTO STACKED OPTICAL DEVICES

FIELD

The present invention relates to optical devices and particularly, to systems that transfer the light signals from one optical device to another optical device.

BACKGROUND

Optical communication systems have been developed that use optical devices stacked on top of one another. The optical devices can include optical vias that allow light signals to travel from one of the devices and through another one of the devices so it can be received at yet another device. As these systems become more sophisticated, the path that a light signal travels through these systems also becomes more complex. As the complexity of these optical pathways increases, the amount of loss experienced by these light signals also increases. As a result, there is a need for retention of signal strength in these systems.

SUMMARY

An optical system includes optical devices that each have functional sides between lateral sides. The functional sides include a top side and a bottom side. A first one of the devices has an optical amplifier, a first waveguide, and a first port. A second one of the devices has a second port optically aligned with a second waveguide. The second device is positioned over one of the functional sides of the first device. The optical amplifier is optically positioned between the first waveguide and the first port such that a light signal from the first waveguide enters the amplifier and travels through the amplifier. The first port is configured to receive the light signal from the optical amplifier and change the direction that the light signal is traveling such that the light signal exits the first device traveling in a direction that is toward the second device. The second port is configured to receive the light signal after the light signal exits the first device and to change a direction that the light signal is traveling such that the light signal enters the second waveguide.

Another embodiment of the optical system includes optical devices that each has functional sides between lateral sides, the functional sides including a top side and a bottom side. A first one of the devices has an optical amplifier, a first waveguide, and a first port. A second one of the devices has a second port optically aligned with a second waveguide. The second device is positioned over one of the functional sides of the first device. The second port is configured to receive the light signal from the second waveguide and change a direction that the light signal is traveling such that the light signal exits the second device traveling in a direction that is toward the first device. The first port is configured to receive the light signal after the light signal exits the second device and to change a direction that the light signal is traveling such that the light signal enters the amplifier. The amplifier is optically positioned between the first waveguide and the first port such that the light signal entering the amplifier from the first port travels through the amplifier and enters the first waveguide.

An optical system includes optical devices that each has a top side and a bottom side between lateral sides. The optical devices are stacked such that a first one of the optical devices is positioned between the bottom side of a second one of the devices and the top side of a third one of the optical devices. The second device has one or more second waveguides immobilized on a base. The third device has one or more third waveguides immobilized on a base. The first device has a via that defines an optical path that extends from the top side of the first device to the bottom side of the first device. The first device is positioned such that a light signal traveling between one of the second waveguides and one of the third waveguides travels through the via. The optical path defined by the via crosses an interface between multiple light transmitting media. The interface is shaped so as to change a direction of the light signal as the light signal travels through the via and to focus the light signal as the light signal travels through the via.

An optical system includes optical devices that each has a top side and a bottom side between lateral sides. The optical devices are stacked such that a first one of the optical devices is positioned between the bottom side of a second one of the devices and the top side of a third one of the optical devices. The second device has one or more second waveguides immobilized on a base. The third device has one or more third waveguides immobilized on a base. The first device has a via and a wedge. The via defines an optical path that extends from the top side of the first device to the bottom side of the first device. The optical path defined by the via extending through the wedge. The first device is positioned such that a light signal traveling between one of the second waveguides and one of the third waveguides travels through both the wedge and the via.

An optical system includes optical devices that each has functional sides between lateral sides. The functional sides include a top side and a bottom side. A first one of the devices has a first wedge, a first waveguide, and a first port. A second one of the devices has a second waveguide. The second device is positioned over one of the functional sides of the first device. The first device and the second device are arranged such that a light signal traveling between the first waveguide and the second waveguide travels through the first wedge and the first port with the first wedge and the first port being optically between the first waveguide and the second waveguide. Additionally, the first device and the second device are arranged such that the light signal approaches or exits the second device at a non-perpendicular angle relative to a plane of the second device. The first port includes a reflecting side configured to reflect the light signal as the light signal travels through the first port.

A method of forming an optical device includes placing an amplifier in a pit on an optical device. The method also includes removing a portion of the amplifier. The method also includes configuring the device such that the pit is positioned between a waveguide on the device and a port included in the pit, the port having a reflecting surface configured to reflect a light signal traveling through, the port.

BRIEF DESCRIPTION OF THE FIGURES

FIG. 1A is a topview of the device.

FIG. 1B is a cross-section of the device shown in FIG. 1A taken along the line labeled B.

FIG. 1C is a cross-section of the device shown in FIG. 1B taken along the line labeled C.

FIG. 2A is a topview of a device.

FIG. 2B is a cross-section of the device shown in FIG. 2A taken along the line labeled B.

FIG. 2C is a cross-section of the device shown in FIG. 2A taken along the line labeled C.

FIG. 3A is a topview of the optical device.

FIG. 3B is a cross-section of the device shown in FIG. 3A taken along the line labeled B.

DESCRIPTION

Figure 1A:
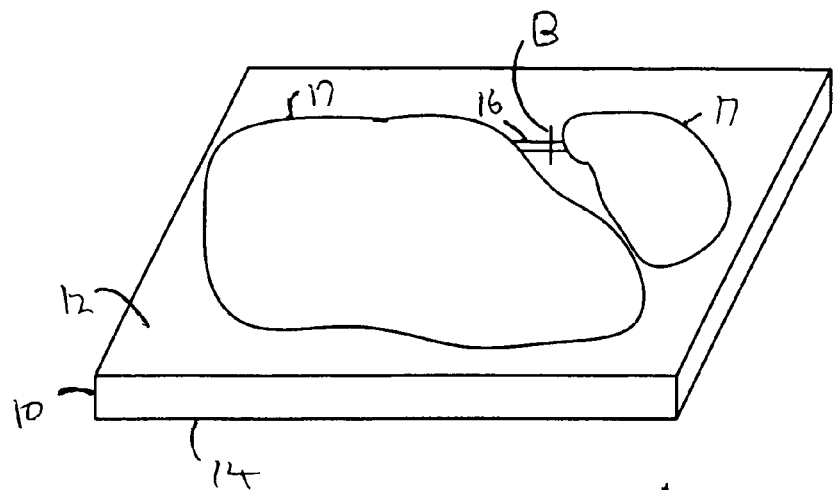
FIG. 1A through FIG. 1C illustrate an optical device within the class of optical devices called planar optical devices.

The system includes optical devices stacked on top of one another. At least a first one of the devices includes an optical amplifier optically positioned between a waveguide and an amplifier port. A light signal exchanged between the amplifier port and the waveguide is amplified as it travels through the amplifier. The amplifier port is configured to receive the light signal from the amplifier and direct the light signal to a second device positioned above or below the first device. The second device can include a second port and a second waveguide arranged such that light signal from the first device travels through the second port and then into the second waveguide. As a result, the system can be configured to amplify a light signal traveling through a waveguide on a first device and to direct the light to a second waveguide on a second device. Alternately, the system can be operated in reverse with the light signal being amplified as it travels from the second waveguide on the second device to the waveguide on the first device. The ability to amplify the light signal allows the system to have complex routing of optical signals while retaining the needed signal intensity.

The amplifier port and the second port include reflecting sides that reflect the light signal as it travels through these ports. The reflection of the light signal changes the direction in which the light signal is traveling between a direction that is parallel to the device and a direction that is toward a location above or below the device. These angle of these reflecting side relative to a plane of the device can be an angle that naturally results from wet etching of crystalline materials. For instance, when the reflecting side is formed in silicon, the reflecting side can be at the 54.7° angle that naturally results from wet etching of silicon. As a result, these reflecting surfaces can be at non-45° angles. Accordingly, the light signals can exit and/or enter the port on a device at an angle that is non-perpendicular to the device. However, the system makes use of wedges and/or optical vias with direction changing functionality. The optical vias provide an optical pathway through a device from the top side of the device to the bottom side of the device and accordingly allow a light signal to pass through a device. The direction changing functionality of the vias and/or wedges can be employed to correct the direction of the light signal from the direction that the light signal enters and/or exits a port to the direction that is desired for efficient routing of the light signals through the system. Additionally, the wedges and/or vias can have lens functionality. For instance, the wedges and/or vias can be configured to reduce spreading of the light signal that results when the light signal travels through free space regions in the system. The ability to achieve the desired directionality of amplified signals through the system combined with the ability to use angled surfaces that are a natural result of etching provides a system that is economical to fabricate while also allowing light signals to be efficiently routed through complex pathways while retaining the desired signal strength.

Figure 1B:
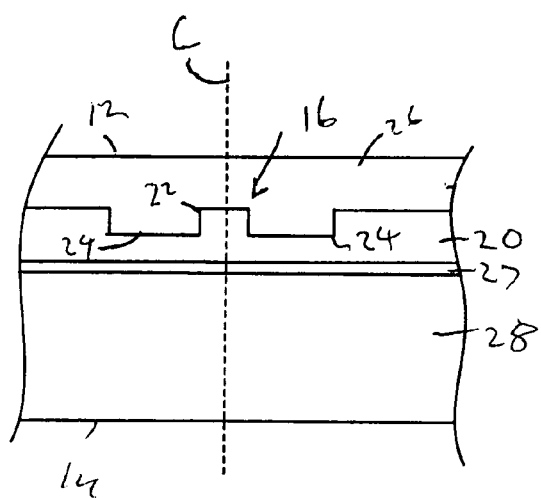
Figure 1C:
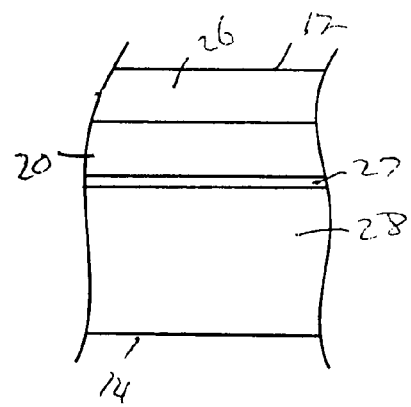

FIG. 1A through FIG. 1C illustrate an optical device. FIG. 1A is a topview of the device. FIG. 1B is a cross-section of the device shown in FIG. 1A taken along the line labeled B. FIG. 1C is a cross-section of the device shown in FIG. 1B taken along the line labeled C. The device is within the class of optical devices known as planar optical devices. These devices typically include one or more waveguides immobilized relative to a substrate or a base. The direction of propagation of light signals along the waveguides is generally parallel to a plane of the substrate or a plane of the base. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extend through the lateral sides 10 of the device. The top side 12 and the bottom side 14 of the device are non-lateral sides.

The device includes one or more waveguides 16 that carry light signals between optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a first light-transmitting medium 20 positioned on a base 18. The first light-transmitting medium 20 includes a ridge 22 defined by trenches 24 extending partially into the first light-transmitting medium 20 or through the first light-transmitting medium 20. Suitable first light-transmitting media include, but are not limited to, silicon, polymers, silica, SiN, GaAs, InP and $LiNbO_3$. A fourth light-transmitting medium 26 is optionally positioned on the first light-light transmitting medium. The fourth light-transmitting medium 26 can serve as a cladding for the waveguide and/or for the device. When the first light-transmitting medium 20 is silicon, suitable fourth light-transmitting media include, but are not limited to, silicon, polymers, and silica.

The portion of the base 18 adjacent to the first light-transmitting medium 20 is configured to reflect light signals from the waveguide 16 back into the waveguide 16 in order to constrain light signals in the waveguide. For instance, the portion of the base 18 adjacent to the first light-transmitting medium 20 can be an optical insulator 27 with a lower index of refraction than the first light-transmitting medium 20. The drop in the index of refraction can cause reflection of a light signal from the first light-transmitting medium 20 back into the first light-transmitting medium 20. The base 18 can include the optical insulator 27 positioned on a substrate 28. As will become evident below, the substrate 28 can be configured to transmit light signals. For instance, the substrate 28 can be constructed of a light-transmitting medium that is different from the first light-transmitting medium 20 or the same as the first light-transmitting medium 20. In one example, the device is constructed on a silicon-on-insulator wafer. A silicon-on-insulator wafer includes a silicon layer that serves as the first light-transmitting medium 20. The silicon-on-insulator wafer also includes a layer of silica positioned on a silicon substrate. The layer of silica can serving as the optical insulator 27 and the silicon substrate can serve as the substrate 28.

Figure 2A:
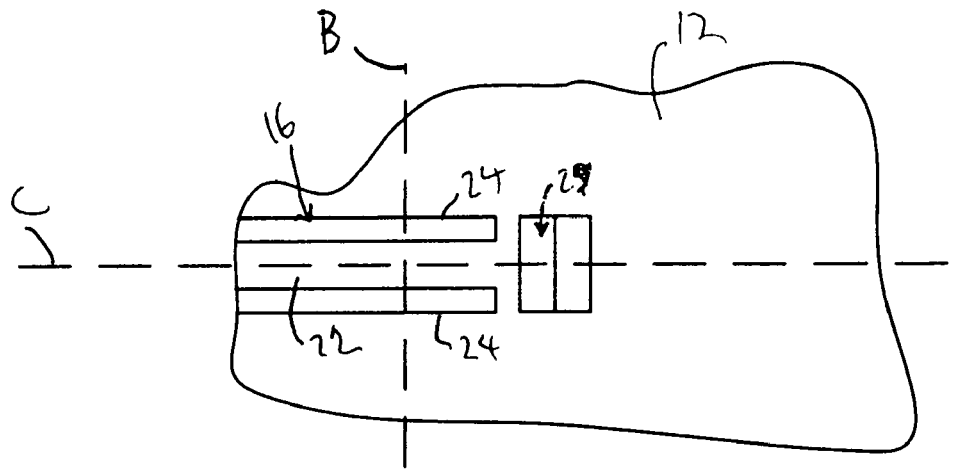
FIG. 2A through FIG. 2C illustrate a portion of an optical device that includes a port configured to receive a light signal from a waveguide or configured to direct light signals from outside of the device into the waveguide.
Figure 2B:
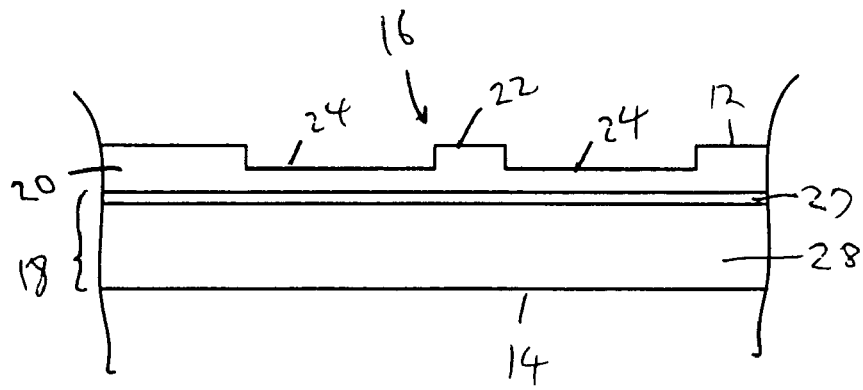
Figure 2C:
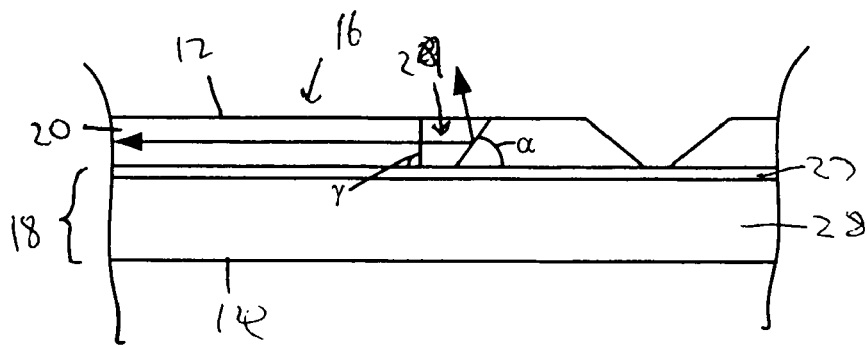

As noted above, an optical port is an example of an optical component that can be included on the optical device. FIG. 2A through FIG. 2C illustrate a portion of an optical device that includes a port configured to receive a light signal from a waveguide 16 or configured to direct light signals from outside of the device into the waveguide 16. FIG. 2A is a topview of the device. FIG. 2B is a cross-section of the device shown in FIG. 2A taken along the line labeled B. FIG. 2C is a cross-section of the device shown in FIG. 2A taken along the line labeled B.

The port includes a port recess 29 that extends into or through the first light-transmitting medium 20. The port recess 29 includes one or more sides. The illustrated port recess 29 includes a bottom side 30 and a plurality of lateral sides including a waveguide side 32 and a reflecting side 34.

A second light-transmitting medium 36 is positioned in the port recess 29. The second light-transmitting medium 36 can be a liquid or a gas and is preferably a solid. The second light-transmitting medium 36 can have a different index of refraction than the first light-transmitting medium 20. Suitable second light-transmitting media include, but are not limited to, air, epoxy, polymers, spin-on glasses and evaporated or sputtered films. An example of a suitable polymer is Polyimide PI2611 that is not a substantial source of stress for an optical device constructed on a silicon-on-insulator wafer.

Figure 2D:
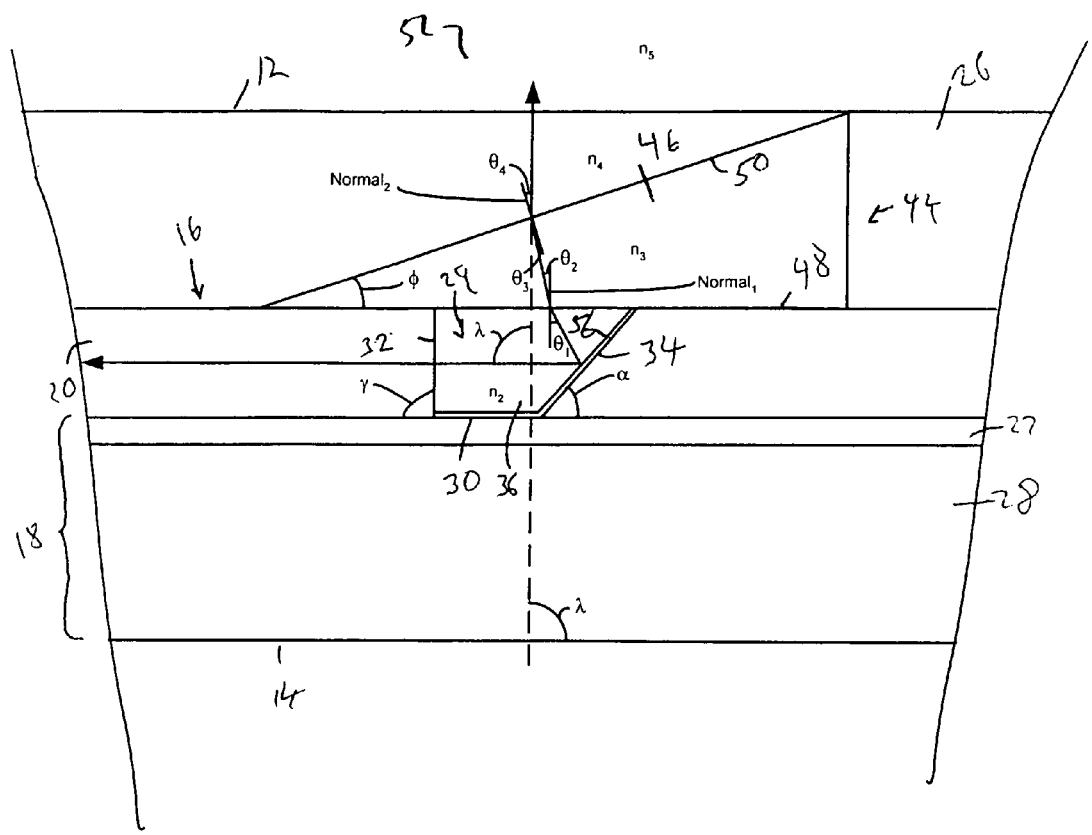
FIG. 2D illustrates a wedge positioned on the optical device of FIG. 2A through FIG. 2C.

As evident in FIG. 2D, the waveguide side 32 can be positioned at an angle $\gamma$ measured relative to the base 18 and the reflecting side 34 can be positioned at an angle $\alpha$ measured relative to the base 18. The angle $\gamma$ can be the same or different from the angle $\alpha$. A suitable range of angles for $\gamma$ and/or $\alpha$ includes, but is not limited to, angles in the range from 0° to 90°, and 45° to 90° and angles less than 89°, 87° or 85°. When the first light-transmitting medium 20 is silicon and the port recess 29 is formed by etching, a suitable angle for $\gamma$ and/or $\alpha$ is about 54.7° since the crystalline structure of the silicon layer causes sides of the port recess 29 to be naturally etched at an angle of about 54.7°. In one example, the angle $\gamma$ is about 90° and $\alpha$ is about 54.7°.

During operation of the device, a light signal guided by the waveguide 16 travels to an end of the waveguide 16 and is traveling in the direction of propagation immediately before exiting the waveguide 16. The light signal exits from the waveguide 16 and is received by the port. The light signal travels through the port. For instance, the light signal travels through the waveguide side 32 of the port recess 29 and accordingly enters the port traveling in a first direction. The first direction can be the same or different from the direction of propagation. For instance, if the direction of propagation is not normal to the waveguide side 32 and the second light-transmitting medium 36 has an index of refraction that is different from the first light-transmitting medium 20, there may be some refraction that changes the direction of the light signal upon the light signal entering the second light-transmitting medium 36. The light signal travels through the second light-transmitting medium 36 to the reflecting side. The reflecting side reflects the light signal. The light signal then travels through the second light-transmitting medium 36 and exits the second light-transmitting medium 36. Before exiting from the second light-transmitting medium 36, the light signal is traveling in a second direction. The second direction is toward a location that is over a non-lateral side of the device such as the top side 12 of the device or the bottom side 14 of the device. FIG. 1B illustrates the second direction as being toward a location that is above the device.

Although the operation of the device is described in the context of a light signal traveling from the waveguide 16 and then through the port, the device can be operated in reverse. For instance, the port can receive a light signal from above the device and then reflect the light signal such that the light signal is received and guided by the waveguide 16.

FIG. 2D illustrates a wedge 44 positioned on the optical device of FIG. 1A through FIG. 2C. The wedge 44 includes or consists of a third light-transmitting medium 46. The third light-transmitting medium 46 can be the same as the second light-transmitting medium 36 or different from the second light-transmitting medium 36. The wedge 44 includes an interface side 48 and a correction side 50. The wedge 44 is positioned so light signals that exit from the port pass through the interface side 48 of the wedge 44, through the third light-transmitting medium 46 and then exit the wedge 44 through the correction side 50. The light signal enters the fourth light-transmitting medium 26 after passing through the correction side 50. The light signal can pass through the fourth light-transmitting medium 26 and into a fifth light-transmitting medium 52.

In FIG. 2D, the interface side 48 has a normal labeled "normal$_1$" and the correction side 50 has a normal labeled "normal$_2$." The second light-transmitting medium 36 has an index of refraction labeled n$_2$. The third light-transmitting medium 46 has an index of refraction labeled n$_3$. The fourth light-transmitting medium 26 has an index of refraction labeled n$_4$. The fifth light-transmitting medium 52 has an index of refraction labeled n$_5$.

During operation of the device, the light signal exits the second light-transmitting medium 36 at an angle $\theta_1$ relative to normal$_1$. The light signal enters the third light-transmitting medium 46 at an angle $\theta_2$ relative to normal$_1$. The light signal approaches the correction side 50 at an angle $\theta_2$ relative to normal$_2$. The light signal exits the third light-transmitting medium 46 at an angle $\theta_4$ relative to normal$_1$.

The wedge 44 is configured such that the light signal exits the correction side 50 traveling in a direction that is substantially perpendicular to the plane of the device. For instance, the light signal exits the correction side 50 traveling in a direction that is substantially perpendicular to a side of the base 18 or to a side of a substrate 28 and/or is parallel to normal$_1$. As an example, the light signal exits the correction side 50 traveling in a direction that is at an angle λ in a range of 88-92° measured relative to the top side of the base 18, the bottom side of the base 18, the top side of the substrate 28, and/or the bottom side of the substrate 28; or in a range of 89-91° measured relative to the top side of the base 18, the bottom side of the base 18, the top side of the substrate 28, and/or the bottom side of the substrate 28; or in a range of 89.5-90.5° measured relative to the top side of the base 18, the bottom side of the base 18, the top side of the substrate 28, and/or the bottom side of the substrate 28. Additionally or alternately, the wedge 44 is configured such that the light signal exits the correction side 50 traveling in a direction that is toward a location above the device and is also substantially perpendicular to a direction of propagation of light signals through the waveguide 16. As an example, the light signal exits the correction side 50 traveling in a direction that is toward a location above the device and is also at an angle λ in a range of 88-92° measured relative to a direction of propagation the light signals through the waveguide; or in a range of 89-91° measured relative to a direction of propagation the light signals through the waveguide; or in a range of 89.5-90.5°, or in a range of 88-92° measured relative to a direction of propagation the light signals through the waveguide. For the purposes of illustration, FIG. 2D illustrates the angle λ measured relative to the bottom of the base 18 or substrate 28 and also relative to the direction of propagation.

Since the wedge provides the substantially perpendicular direction of the light signal exiting from an optical device, the reflecting side in the port can have an angle other than 45°. As a result, the system allows the non-45° surfaces that result from wet-etching crystalline materials to be employed as the reflecting side in a port or to act a support for, or partially define the reflecting side in a port.

The geometry for the wedge 44 can be calculated or approximated from the principles of physics. For instance, n$_2$, n$_3$, $\theta_1$ and $\theta_2$ are related by Snell's law. Additionally, n$_3$, n$_4$, $\theta_3$ and $\theta_4$ are also related by Snell's law. The principles of geometry combined with these relationships shows that the angle φ of the interface side 48 relative to the correction side 50 can be calculated or approximated from tan $$\phi = \frac{-n_2\cos 2\alpha}{\sqrt{n_3^2 - n_2^2\cos^2 2\alpha} - n_4}.$$

Suitable materials for the third light-transmitting medium 46 include, but are not limited to, silica, silicon nitride and silicon. In many instances, it may be desirable for the third light-transmitting medium 46 to have a higher index of refraction than the second light-transmitting medium (n$_3$>n$_2$). This relationship can result in a lower value of angle φ. Suitable materials for the fourth light-transmitting medium 26 include, but are not limited to, solids, liquids, or gasses such as air, silica or polymers. In some instances, the fourth light-transmitting medium 26 also acts as a cladding for waveguide and/or the device. When the first light-transmitting medium 20 is silicon, a suitable fourth light-transmitting medium 26 includes silica. Suitable materials for the fifth light-transmitting medium 52 include, but are not limited to, solids, liquids, or gasses such as air, silica or polymers.

The port recess 29 includes an optional reflecting medium 56 to enhance reflection of the light signal in the port recess 29. FIG. 2D shows the reflecting medium 56 on the bottom side 30 and on the reflecting side 34. The reflecting medium 56 can be positioned on the entire bottom side 30 or a part of the bottom side 30. Additionally or alternately, the reflecting medium 56 can be positioned on the entire reflecting side 34 or on a part of the reflecting side 34. Suitable reflecting media include, but are not limited to, reflective metals such as Al and Au.

Figure 2E:
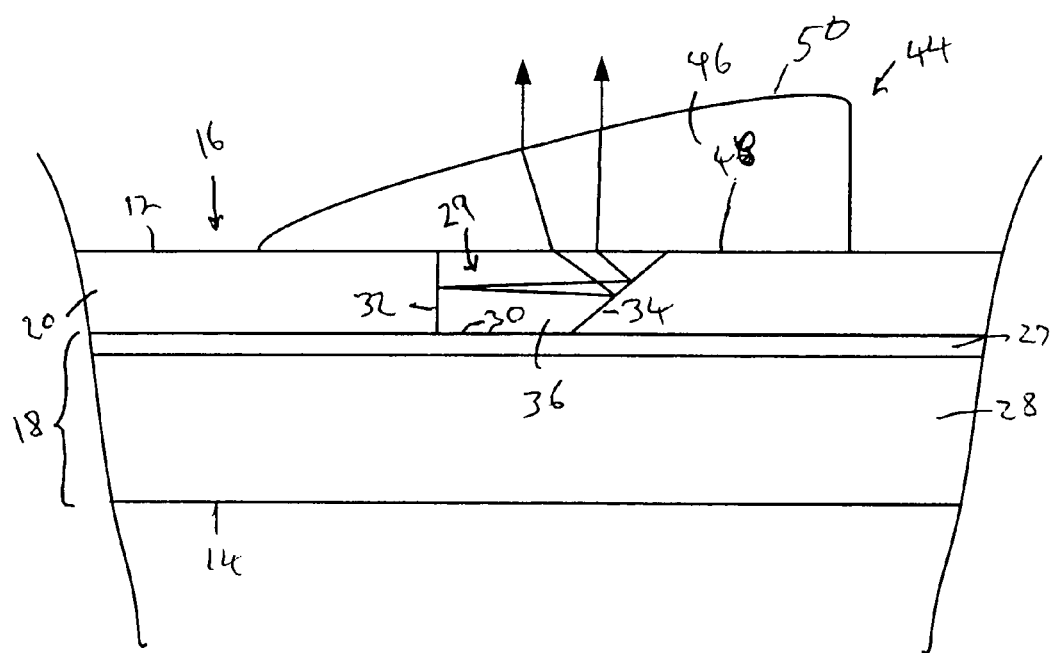
FIG. 2E illustrates a wedge positioned on the optical device of FIG. 2A through FIG. 2C and having a curved side.

Suitable construction of a port according to FIG. 2A through FIG. 2D is provided in U.S. patent application Ser. No. 11/881,745, filed on Jul. 27, 2007, entitled "Efficient Transfer of Light Signals Between Optical Devices," and incorporated herein in its entirety. Although FIG. 2D shows the correction side 50 as being planar, the correction side can be non-planar as illustrated in FIG. 2E. For instance, the lens shaped correction side can be result from adding a lens onto the planar correction side of FIG. 2D. As disclosed in U.S. patent application Ser. No. 11/881,745, the lens contribution to the wedge can be configured to correct the light signal for a variety of optical effects such as diffraction. For instance, the lens can be configured to effectively collimate or focus the light signals that travel through the wedge. Additionally or alternately, the lens can be configured to correct other optical effects such as chromatic aberration.

Figure 3A:
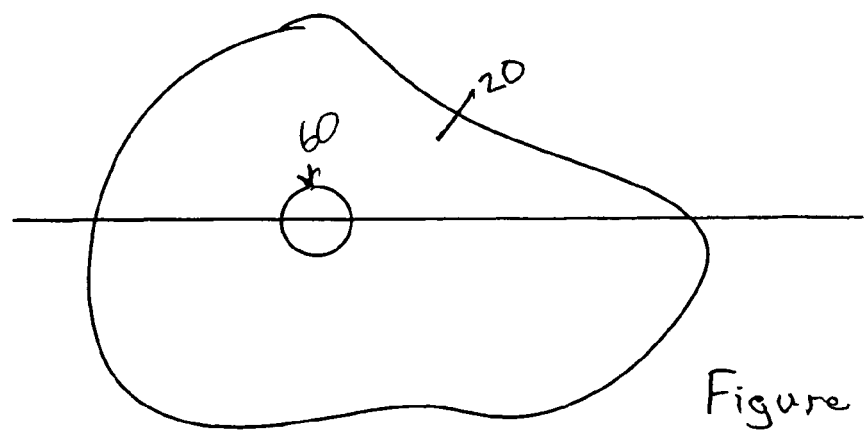
FIG. 3A through FIG. 3B illustrate a portion of an optical device constructed according to FIG. 1A through FIG. 1C and having an optical via.
Figure 3B:
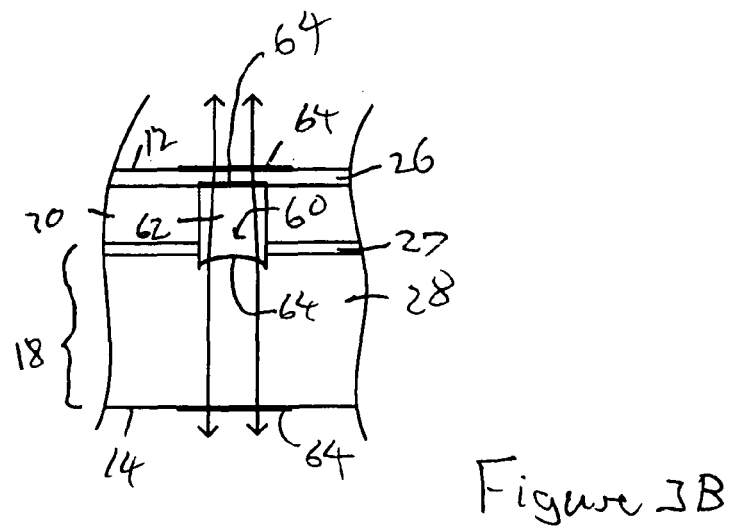

As noted above, a via is an example of an optical component that can be included on an optical device. FIG. 3A through FIG. 3B illustrate a portion of an optical device that includes an optical via. FIG. 3A is a topview of the optical device where the fourth light-transmitting medium 26 is treated as transparent and is accordingly not visible in FIG. 3A. FIG. 3B is a cross-section of the device shown in FIG. 3A taken along the line labeled B.

The device includes a recess 60 extending into the first light-transmitting medium 20 and through the optical insulator 27. The recess 60 serves as a via that provides an optical pathway through the device. For instance, the recess 60 provides an optical pathway from the top side 12 of the device to the bottom side 14 of the device or from the bottom side 14 of the device to the top side 12 of the device. In some instances, the recess 60 can have dimensions that guide a light signal traveling through the recess. For instance, a sixth light-transmitting medium 62 positioned in the recess 60 can have a higher index of refraction than the first light-transmitting medium 20, and/or optical insulator 27, and/or substrate 28. Accordingly, the portion of the via defined by the recess can be a free space region but need not be a free space region.

In some instances, the sixth light-transmitting medium 62 fills the recess 60. When the first light-transmitting medium 20 is silicon, a suitable sixth light-transmitting medium 62 includes polymers, spin-on glasses and evaporated or sputtered films. A layer of the fourth light-transmitting medium 26 can be positioned over the sixth light-transmitting medium 62 in the recess 60.

The interface between the substrate 28 and the sixth light-transmitting medium 62 can be planar or curved. The illustrated interface is curved and can be configured to provide lens functionality. For instance, the interface can be curved so as to collimate the light signal or to converge the light signal as the light signal travels through the fourth light-transmitting medium 26. For instance, FIG. 3B illustrates the interface configured to converge the light signal as the light signal travels from the substrate 28 through the sixth light-transmitting medium 62.

As evident in FIG. 3B, a portion of the base 18 acts as a facet through which a light signal traveling through the via enters the device or exits the device. This facet can optionally be coated with an anti-reflective coating 64 to discourage reflection of light signals entering the device or exiting the device. When the portion of the base 18 acting as a facet is constructed of silicon, a suitable anti-reflective coating 64 includes, but is not limited to, single-layer coatings such as silicon nitride or aluminum oxide, or multilayer coatings which may contain silicon nitride, aluminum oxide, and/or silica. Additionally, a portion of the fourth light-transmitting medium 26 acts as a facet through which a light signal traveling through the via enters the device or exits the device. This facet can optionally be coated with an anti-reflective coating 64 to discourage reflection of light signals entering the device or exiting the device. When the fourth light transmitting is constructed of silica, a suitable single-layer anti-reflective coating 64 includes, but is not limited to, magnesium fluoride. A portion of the fourth light-transmitting medium 26 acts as a facet through which a light signal traveling through the via enters the sixth light-transmitting medium 62 or exits the sixth light-transmitting medium 62. This facet can optionally be coated with an anti-reflective coating 64 to discourage reflection of light signals entering the device or exiting the device. When the fourth light transmitting is silica and the sixth light-transmitting medium 62 is air, a suitable anti-reflective coating 64 includes, but is not limited to, single-layer coatings such as magnesium fluoride, silicon nitride, or aluminum oxide, or multi-layer coatings which may contain one component, more than one component, or all of the components selected from a group consisting of magnesium fluoride, silicon nitride, aluminum oxide, and silica. A portion of the sixth light-transmitting medium 62 acts as a facet through which a light signal traveling through the via enters the substrate 28 or exits the substrate 28. This facet can optionally be coated with an anti-reflective coating 64 to discourage reflection of light signals entering the device or exiting the device. When the sixth light transmitting is air and the substrate 28 is constructed of silicon, a suitable anti-reflective coating 64 includes, but is not limited to, single-layer coatings such as magnesium fluoride, silicon nitride, or aluminum oxide, or multi-layer coatings which may contain one component, more than one component, or all of the components selected from a group consisting of magnesium fluoride, silicon nitride, aluminum oxide, and silica.

Although FIG. 3B illustrates the recess 60 extending past the optical insulator 27 so that there is no optical insulator 27 present in the optical path provided by the recess 60, the recess 60 need not extend past the optical insulator 27. However, extension of the recess 60 past the optical insulator 27 can reduce the number of material interfaces experienced by the light signal as the light signal travels through the via and can accordingly reduce optical loss. Combining the reduced number of material interfaces combined with anti-reflective coatings 64 can further reduce the level of optical loss caused by the via.

Figure 3C:
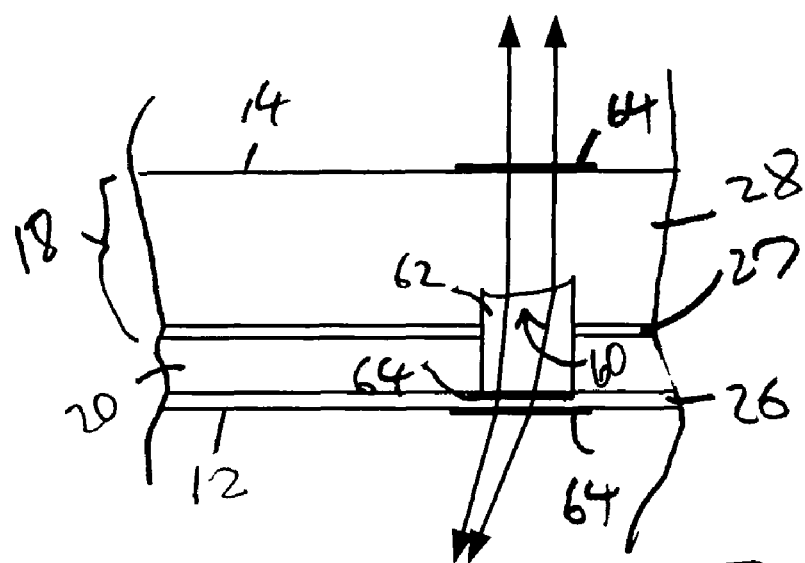
FIG. 3C is another embodiment of a cross-section of the device shown in FIG. 3A taken along the line labeled B.

In some instances, it may be desirable to combine the functions of the wedge and the lens-shape interface in a via. For instance, it may be desirable to add a planar wedge shape to a lens shaped interface between the substrate 28 and the sixth light-transmitting medium 62. FIG. 3C illustrates a via where the interface provides both direction changing functionality and lens functionality. For instance, the interface has a shape that results from the addition of a planar wedge to the lens shaped interface of FIG. 3B. The resulting interface can provide the function of the wedge by changing the direction of light signals so they exit the device in a direction that is substantially perpendicular to the device and can also provide the function of the lens shaped interface by correct for optical effects such as diffraction. For instance, the lens shaped interface can collimate, or focus a light signal as it travels through the device. Providing a via that incorporates the function of a wedge can permit light signals to approach a device from a non-perpendicular direction and can accordingly reduce the need for a wedge.

Figure 4:
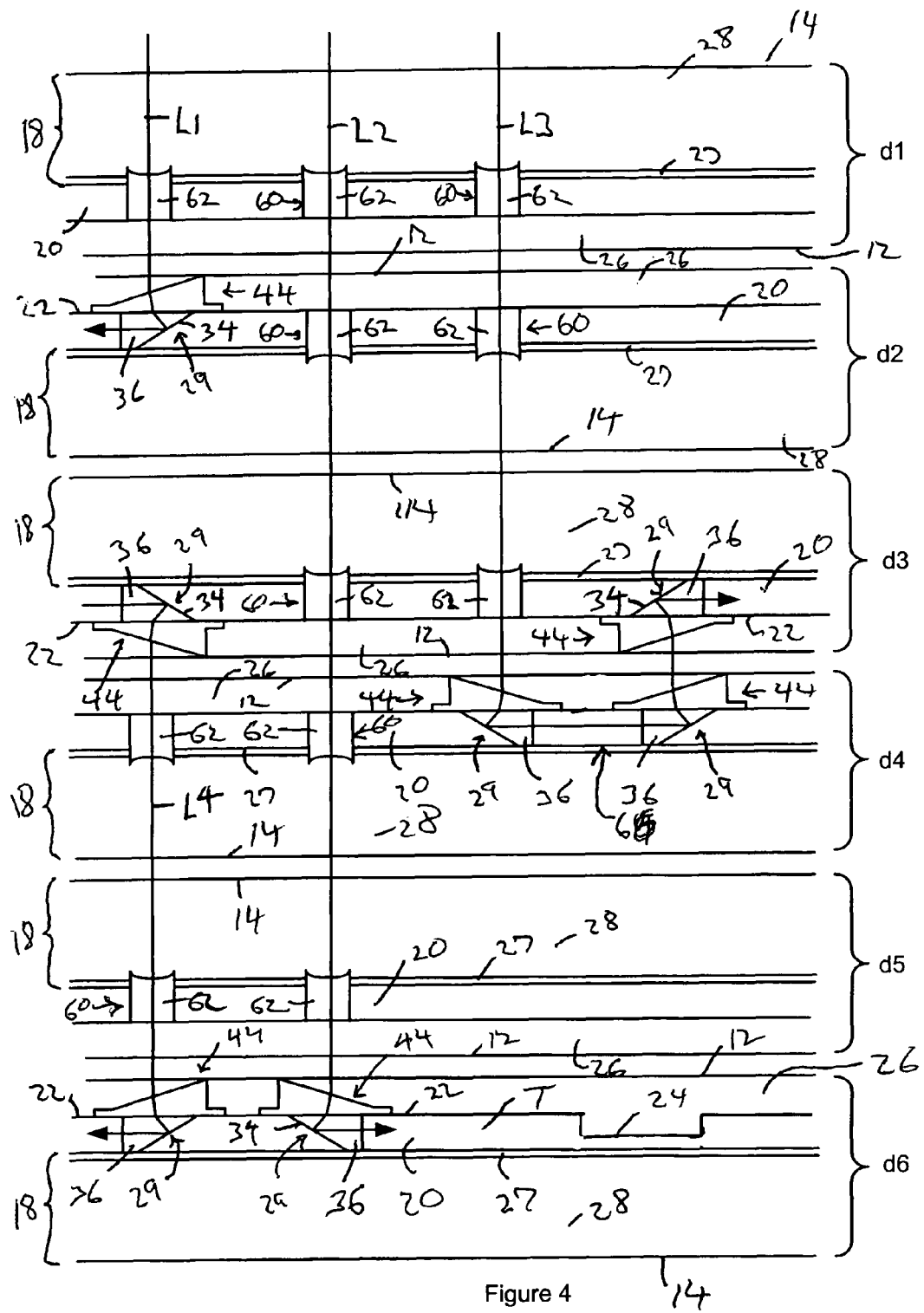
FIG. 4 illustrates a system that includes a plurality of devices constructed with ports and vias according to FIG. 1A through FIG. 3B and arranged such that a light signal from outside of the system or from inside of the system can be routed between different devices in the system.

FIG. 4 illustrates a system that includes a plurality of the devices. The illustrated system includes six device labeled d1 through d6. The devices are positioned such that each device has a top side 12 that is adjacent to the top side 12 of another device and/or has a bottom side 14 that is adjacent to the bottom side 14 of another device. Each device is positioned to receive a light signal from at least one of the other devices and/or each device is configured to output a light signal that is received by another one of the devices.

In FIG. 4, the devices are illustrated as being separated by a free space region where the light signals are not guided. The material between the devices can be a gas such as air or such as the ambient atmosphere in which the devices are placed. The devices can also be separated by a solid material. In some instances, when the system includes a solid between adjacent devices, the system can be identified by the repeating materials that are associated with repeating component platforms. For instance, the system can be identified by the repeating materials of a silicon-on-insulator wafer since each of the silicon-on-insulator wafers includes a silica insulator between a silicon substrate and another silicon layer for guiding of waveguides. The repeating pattern of dimension for the repeating materials can also be present in the system. For instance, the silica insulator, silicon substrate and silicon layer for guiding of waveguides will have about the same thickness on each of the devices.

The device labeled d1 (device d1) includes three vias constructed according to FIG. 3A through FIG. 3B. The device d2 includes two vias constructed according to FIG. 3A through FIG. 3B and a port constructed according to FIG. 2A through FIG. 2E. The device d3 includes two vias constructed according to FIG. 3A through FIG. 3B and two port constructed according to FIG. 2A through FIG. 2E. The device d4 includes two vias constructed according to FIG. 3A through FIG. 3B and two ports constructed according to FIG. 2A through FIG. 2E. The device d5 includes two vias constructed according to FIG. 3A through FIG. 3B. The device d6 includes two ports constructed according to FIG. 2A through FIG. 2E. FIG. 4 shows only a portion of each device, as a result, the devices can include other optical components for processing of light signals such as the optical components discussed in the context of FIG. 1A through FIG. 1C. Additionally, each device can include additional ports and vias that are not evident in FIG. 4. Some of the details that are evident in FIG. 2A-3B are not evident in FIG. 4 in order to simplify the illustration. For instance, anti-reflective coatings 64 that are present in the via of FIG. 3B are not evident in the vias illustrated in FIG. 4.

The ports and vias can be arranged such that a light signal can be routed from any one of the devices to a waveguide on any one of the other devices. Alternately, the ports and vias can be arranged such that a light signal that the system receives from outside the system can be routed to any one of the devices. For instance, the device d1 can receive the light signal labeled L1 (light signal L1) from outside of the system and route the light signal L1 to the device d2. In particular, the device d1 receives the light signal L1 from outside of the system, the light signal L1 travels through a via in device d1 and is received at the port in the device d2. The port in the device d2 directs the light signal L1 into a waveguide on device d2. As a result, the system routes a light signal from outside of the system into a waveguide on device d2. The system can also route a light signal received from outside of the system to a device located deeper in the system. For instance, FIG. 4 shows device d1 receiving light signal L2 from outside of the system and routing light signal L2 to device d6.

Light signal L1 and light signal L2 are each received from outside of the system and routed to an optical device where the first interaction between the light signal and the device is between the light signal and the top side 12 of the device. The system can employ a device having a return waveguide to route light signals received from outside of the system to an optical device arranged so the first interaction between the light signal and the device is between the light signal and the bottom side 14 of the device. For instance, device d4 includes a return waveguide 66 that returns light signal L3 to device d3. In particular, light signal L3 is received from outside of the system and travels through aligned vias in device d1, d2, and d3. The light signal L3 travels through the via in d3 and is received at the port in device d4. The port in device d4 directs light signal L3 to a return waveguide 66 that carries light signal L3 to a second port that directs lights signal L3 to a port on device d3. The port on device d3 directs the returned light signal to a waveguide on device d3. As a result, the first interaction between light signal L3 and device d3 occurs when light signal L3 travels through the via in device d3, however, the return waveguide 66 and ports in device d4 return lights signal L3 to device d3.

As an alternative to a return waveguide, ports are known that direct light signals from a waveguide on a device to locations below a device or that receive light signals from below the device and direct the light signals into a waveguide on the device. The system can employ ports with this alternate construction to eliminate the use of a return waveguide. For instance, the via in device d4 that receives light signal L3 could be replaced with a port having this alternate construction in order to eliminate the return waveguide illustrated in FIG. 4.

Although FIG. 4 illustrates the system receiving light signals from outside of the system, the light signal can originate within the system. For instance, one or more of the devices can include a light source such as a laser. The light source can serve as a source of a light signal that is routed within the system. As a result, a light signal can be routed between devices in the system. As an example, device d3 can be configured to process light signal L4 and then direct light signal L4 to a waveguide that carries light signal L4 to a port on device d3. The port on device d3 can direct the light signal to device d4 where light signal L4 travels through a via in device d4, through a via on device d5, to a port on device d6. The port on device d6 can direct light signal L4 into a waveguide on device d6. The waveguide on device d6 can carry light signal L4 to a component for additional processing.

Although many of the waveguides in FIG. 4 are shown as having a length that is parallel to the plane of the page, the waveguides can turn into the page and/or out of the page as illustrated by the waveguide labeled T on device d6. The waveguide labeled T appears to suddenly terminate in FIG. 4, however, this termination can result from the waveguide labeled T turning into the page or out of the page.

As evident in FIG. 4, a via in one device must be horizontally aligned with a via or port on an adjacent device. The alignment can be achieved using alignment techniques and structures disclosed in U.S. patent application Ser. No. 11/881,745. For instance, the top side 12 and/or bottom side 14 of each device can include an alignment recess that extends into the device. Adjacent devices can then be horizontally aligned by placing an alignment structure in an alignment recess on each of the devices. As a result, the alignment structure will span the alignment recesses on adjacent devices. Examples of suitable alignment structures include balls, spheres, rods, and cylinders.

The ports on each of the devices in FIG. 4 include a wedge 44. As disclosed in the context of FIG. 3A through FIG. 3E, these wedges 44 can be configured to makes the light travel away from a device in a direction that is substantially perpendicular to the device. Additionally, since the optical devices in the system can be substantially parallel to each other, the use of these wedges 44 can encourage the light signals to enter and/or exit the vias in a direction that is substantially perpendicular to the device that includes the via. For instance, the system can be constructed such that the light signals enter or exit a via at an angle in a range of 88° to 92° relative to a plane defined by a bottom side 14 of the device having the via. As a result of the substantially perpendicular direction that the light signal travels away from the devices and/or toward the devices, the effects of variable displacement between adjacent devices can be greatly reduced or eliminated. As a result, the system is not associated with substantial vertical alignment issues.

Although the system illustrated in FIG. 4 includes six devices, the system can include other numbers of devices. For instance, the system can include more than six devices. In some instances, the system includes two or more devices, three or more devices, or six or more devices.

Although FIG. 4 illustrates devices positioned such that each device has a top side 12 that is adjacent to the top side 12 of another device and/or has a bottom side 14 that is adjacent to the bottom side 14 of another device, the devices can be arranged such that one or more of the devices has a top side 12 that is adjacent to the bottom side 14 of another device. For instance, a first one of the devices can have a top side 12 that is adjacent to the bottom side 14 of a second one of the devices. The first device can include a port that directs the light signal through a via included on the second device. Additionally, although the system is disclosed in the context of ports that direct light signals to locations above the devices, ports are known that direct light signals from a waveguide on a device to locations below a device or that receive light signals from below the device and direct the light signals into a waveguide on the device. The system can employ ports with this alternate construction to permit the top side 12 of one device to be positioned adjacent to the bottom side 14 of another device. Further, ports with this alternate construction can be employed with these ports to provide light signals that exit the device in a direction that is substantially perpendicular to the device and is also in a direction toward a location under the device.

Although FIG. 4 illustrates light signals traveling through the system in a particular direction and the associated text describes the light signal as traveling in the illustrated direction, the illustrated direction is for illustrative purposes and the system can be operated with one or more of the light signals traveling through the system in the opposite direction. Although FIG. 4 is described in the context of light signals traveling a particular direction through the system, the system can be operated with one or more of the light signals traveling through the system in the opposite direction.

Figure 5:
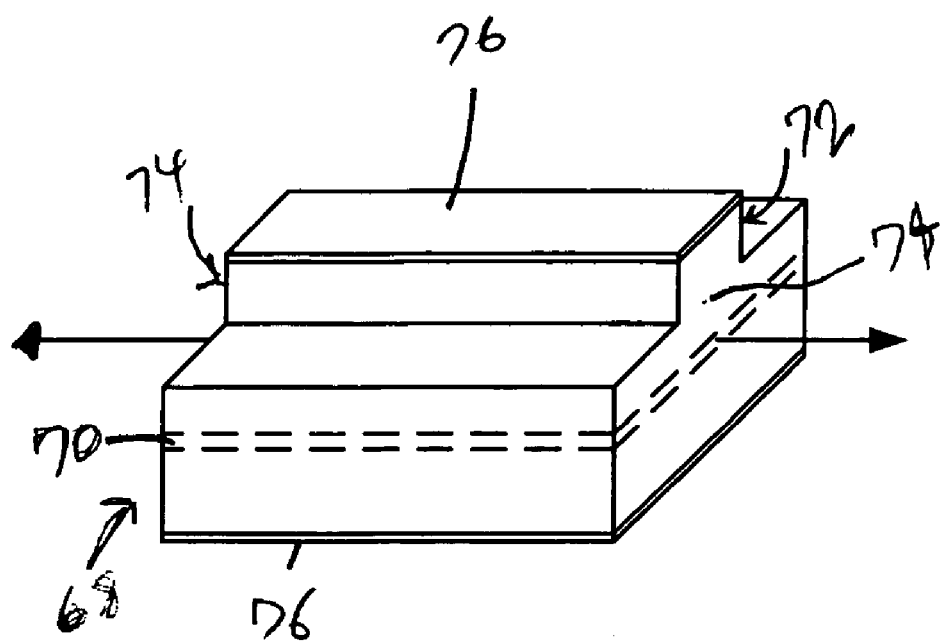
FIG. 5 is a perspective view of an amplifier that can be incorporated into a system such as the system of FIG. 4.

The light signals illustrated in FIG. 4 can experience optical loss as they travel through the system. Accordingly, it may be desirable to incorporate an amplifier into the system. FIG. 5 is a perspective view of an amplifier that can be incorporated into a system such as the system of FIG. 4. The amplifier belongs to the class of amplifiers that are generally called semiconductor optical amplifiers (SOAS).

The amplifier includes a gain medium 68 through which a light signal can travel as illustrated by the arrow labeled A. Suitable gain media include the gain media that are typically employed for solid state lasers. A suitable example of a gain medium 68 is an InP gain medium. The gain medium 68 includes a gain layer 70. The gain layer 70 can have a different index of refraction than the adjacent gain medium 68. For instance, the index of refraction of the gain layer 70 can be selected such that a light signal passing through the gain layer 70 is vertically constrained within the gain medium 68. Additionally, the gain medium 68 can include a ridge 72. The dimensions of the ridge 72 and the distance of the ridge 72 from the gain layer 70 can be selected such that the ridge 72 horizontally constrains the light signal within the gain medium 68. As a result, the ridge 72 and the gain layer 70 serve to guide the light signal through the gain medium 68.

The gain medium 68 includes facets 74 through which the light signal enters and exits the gain medium. Each of the facets 74 or one of the facets 74 can optionally include an anti-reflective coating to reduce reflection of a light signal upon entry or exit from the gain medium 68. Electrical contacts 76 in contact with the gain medium 68 can be employed to provide electrical energy that is the source of the light signal amplification to the gain medium 68. For instance, the electrical contact 76 can be employed to apply an electrical current or potential across the gain medium 68.

Figure 6A:
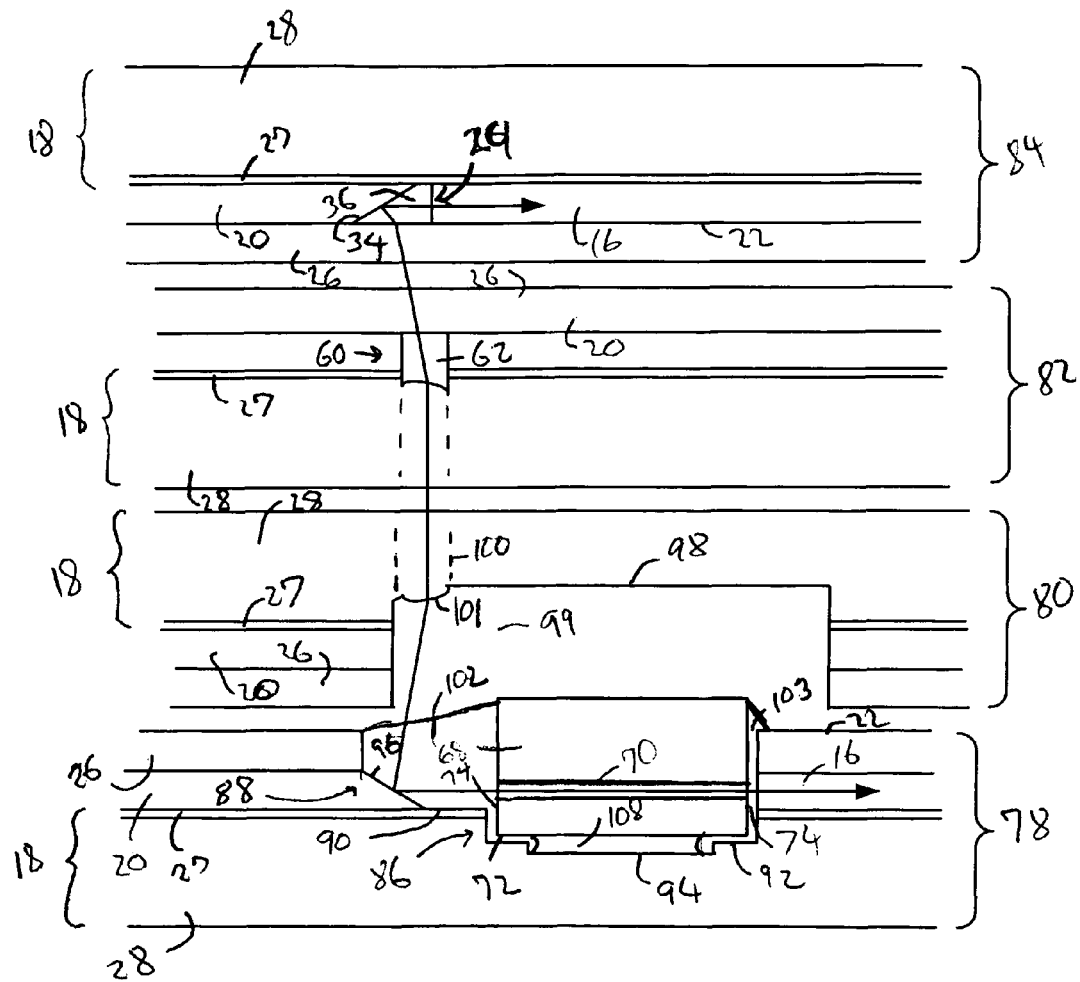
FIG. 6A is a cross section of an amplifier such as the amplifier of FIG. 5 incorporated into a system such as the system of FIG. 4. The system includes a device having an optical via with different media positioned in the via. An interface between different media extends across the optical path through the via and provides the via with both lens functionality and functionality that changes a direction of a light signal traveling through the via.

FIG. 6A is a cross section of an amplifier such as the amplifier of FIG. 5 incorporated into a system such as the system of FIG. 4. The system includes a first device 78, a second device 80, a third device 82, and a fourth device 84. The first device 78 includes an amplifier pit 86. The amplifier pit 86 includes an amplifier port 88 configured to change the direction of a light signal traveling through the amplifier port 88. The amplifier pit 86 also includes a primary recess 90 that extends through the first light-transmitting medium 20 down to the optical insulator 27. The amplifier pit 86 also includes a secondary recess 92 extending into the bottom of the primary recess 90. The secondary recess 92 extends through the optical insulator 27 and in some instances, extends into the substrate 28. The amplifier pit 86 can also optionally include a tertiary recess 94 extending into the bottom of the secondary recess 92.

The amplifier is positioned in the amplifier pit 86. In order to simplify the illustration, the electrical connections for the amplifier are not illustrated. The ridge 72 for the amplifier is positioned in the pit. The depth of the secondary recess 92 and/or the tertiary recess 94 is selected to permit a facet 74 of the amplifier to be aligned with a waveguide 16 such that a light signal exiting the waveguide 16 enters the amplifier and is amplified as it travels through the amplifier. Additionally, the other facet 74 is aligned with the amplifier port 88 such that after the light signal is amplified, the light signal travels through the amplifier port 88. The amplifier port 88 can be constructed according to the port disclosed in the context of FIG. 2A through FIG. 2C. For instance, the amplifier port 88 can include a reflecting side 96 configured to reflect a light signal traveling through the amplifier port 88. Accordingly, the light signal exits the amplifier after being amplified and is then reflected by the reflecting side 96. The reflecting side 96 is configured to reflect the light signal in a direction toward a location that is above the first device 78 or below the first device 78. In FIG. 6A, the reflecting side 96 is configured to reflect the light signal toward the second device 80.

The second device 80 includes a secondary amplifier pit 98. The secondary amplifier pit 98 is sized to receive any portion of the amplifier that extends past the gap between the first device 78 and the second device 80. As a result, the presence of the secondary amplifier pit 98 increases the range of amplifiers that can be used in the system. A seventh light-transmitting medium 99 is positioned in the secondary amplifier pit 98. Additionally, an optical via 100 provides an optical pathway from the top side of the second device 80 to the bottom side of the second device 80. The optical path defined by the via 100 crosses the secondary amplifier pit 98. The second device 80 is aligned with the first device 78 such that the via 100 receives a light signal that exits the amplifier and is then reflected off the reflecting side 96. The via 100 includes an interface 101 between the substrate 28 and the seventh light-transmitting medium 99 that is constructed according to FIG. 3C. For instance, the interface 101 provides the via 100 with both lens functionality and direction changing functionality. In particular, the interface 101 shape results from a combination of a lens and a planar wedge such as the interface of FIG. 3B. The lens contribution to the interface 101 can serve to collimate the light signal, focus the light signal, or correct for other optical effects. For instance, the lens contribution can focus or collimate the light signal in order to correct for diffraction or signal spreading than can occur as the light signal travels through the free-space regions between the amplifier and the waveguide 16 on the second device 80. For instance, the lens contribution can correct for diffraction or signal spreading that occurs in the free space of the amplifier port 88 and between devices.

In addition to the lens contribution to the interface 101 in the via 100, the wedge contribution to the interface 101 is selected such that the light signals that travels from the first device 78 through the via 100 exits the via 100 and/or the second device 80 in a direction that is substantially perpendicular to the second device 80 and/or the via 100. As a result, as is shown in FIG. 6A, the light signal can approach the second device 80 from a non-perpendicular direction while exiting the second device 80 in a perpendicular direction. Since the via 100 allows the light signal to approach the second device 80 from a non-perpendicular direction, the reflecting side 96 in the amplifier port 88 can have an angle other than 45°. As a result, the use of a via 100 structure according to FIG. 3C allows the non-45° surfaces that result from wet-etching crystalline materials to be employed as the reflecting side 96 in the amplifier port 88, to support the reflecting side 96 in the amplifier port 88 or to at least partially define the reflecting side 96 in the amplifier port 88.

The third device 82 includes an optical via. The third device 82 is aligned with the second device 80 such that the via in the third device 82 receives a light signal that exits the via in the second device 80. The interface between the substrate 28 and the seventh light-transmitting medium 99 is constructed according to FIG. 3C. For instance, the interface provides the via with both lens functionality and direction changing functionality. In particular, the interface shape includes a combination of a lens and a planar wedge such as the interface of FIG. 3B. The lens contribution to the interface can serve to collimate the light signal, focus the light signal, or correct for other optical effects. For instance, the lens contribution can focus or collimate the light signal in order to correct for diffraction or signal spreading than can occur as the light signal travels through the free-space regions between optical devices. The wedge contribution can correct the light signal for direction. For instance, the wedge contribution to the interface can be selected such that the light signals that travels from the second device 80 through the via exits the second device 80 traveling in a particular direction relative to the plane of the second device 80. In some instances, the particular direction is not perpendicular to the plane of the second device 80 as will become evident below.

The via in the third device 82 is optically aligned with a port in the fourth device 84. Accordingly, the fourth device 84 is aligned with the third device 82 such that the light signal that travels through the via in the third device 82 is reflected off the reflecting side 34 in the port and enters a waveguide 16 on the fourth device 84. The via in the third device 82 is configured to correct the direction of the light signal such that light signal exits the second device 80 traveling in a particular direction that is not perpendicular to the plane of the second device 80. The direction is selected such that after being reflected off the reflecting side 34 in the port, the light signal enters the waveguide 16 traveling in a direction that is into the waveguide 16 traveling in a direction that is substantially parallel to the axis of the waveguide 16 (parallel to the direction of propagation of light signals through the waveguide).

Since the structure of the via in the third device 82 allows the light signal to approach the fourth device 84 in a direction that is not perpendicular to the plane of the fourth device 84, the reflecting side 34 in the port of the fourth device 84 need not have a 45° surface in order for the light signal to be reflected at the correct angle for entry into the waveguide 16 on the fourth device 84. As a result, the use of a via structure according to FIG. 3C allows the non-45° surfaces that result from wet-etching crystalline materials to be employed as the reflecting side 34 in the port, to support the reflecting side 34 in the port or to at least partially define the reflecting side 34 in the port.

Although the system is described above in terms of a light signal being amplified as it travels from a waveguide 16 on the first device 78 to a waveguide 16 on a fourth device 84, the system can be operated in the reverse direction. For instance, the system can be operated such that the light signal is amplified as it travels from the waveguide 16 on the fourth device 84 to the waveguide 16 on the first device 78.

The reflecting side 96 in the amplifier port 88 can have construction such as the reflecting side 96 in the ports. For instance, a reflecting medium can optionally be positioned on the reflecting side 96 to enhance reflection of the light signal on the reflecting side 96. The reflecting medium can be positioned on the entire reflecting side 96 or on a part of the reflecting side 96. Suitable reflecting media include, but are not limited to, reflective metals such as Al and Au.

In some instances, an eighth light-transmitting medium 102 may be positioned in the amplifier pit 86 between the facet 74 of the amplifier and the reflecting side 96 and/or a ninth light-transmitting medium 103 may be positioned in the amplifier pit 86 between the facet 74 of the amplifier and the facet of the waveguide 16. In some instances, the eighth light-transmitting medium 102 and the ninth light-transmitting medium 103 are the same material. Suitable materials for the eighth light-transmitting medium 102 include, but are not limited to, index matching gels or epoxies. Suitable materials for the seventh light-transmitting medium 99 include, but are not limited to, gasses and solids such as silica, silicon nitride, and polyimide. In some instances, the seventh light-transmitting medium 99 is air.

Figure 6B:
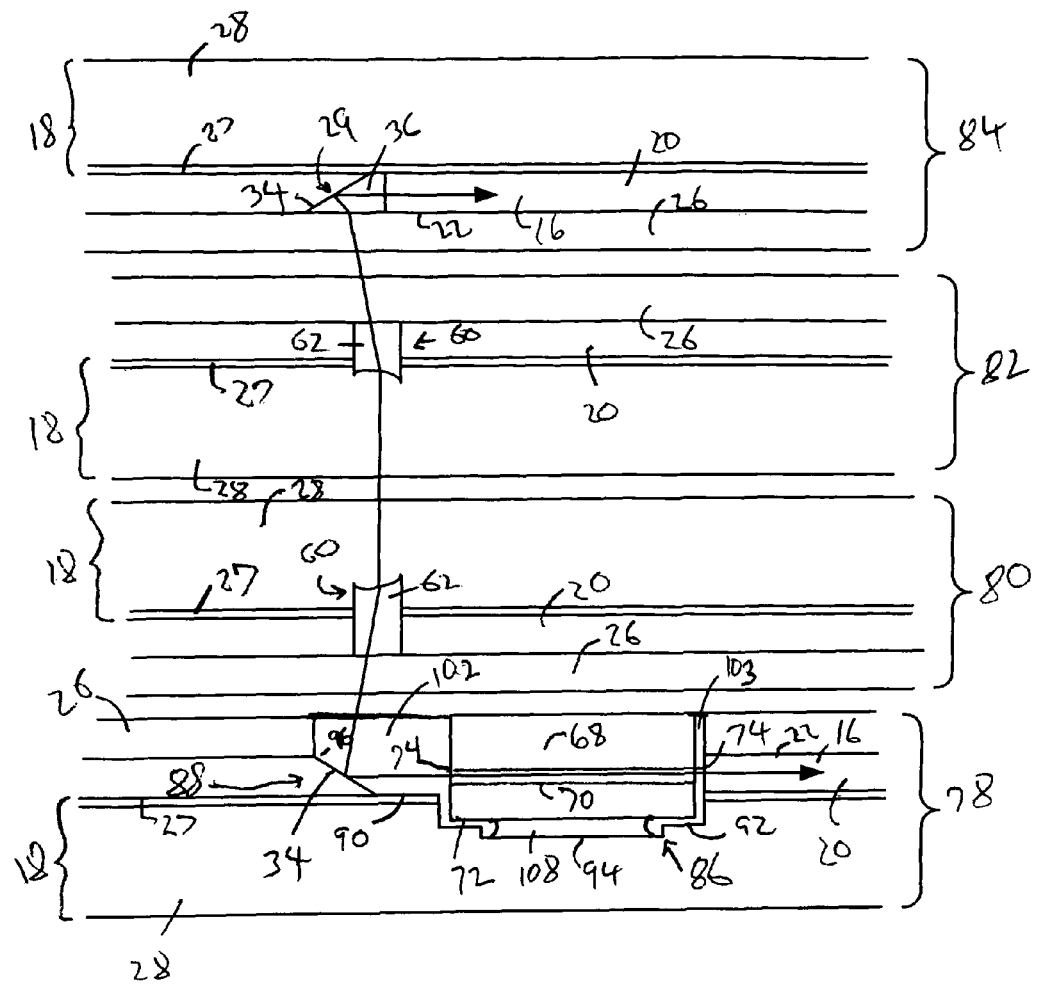
FIG. 6B is another cross section of an amplifier such as the amplifier of FIG. 5 incorporated into a system such as the system of FIG. 4.

In some instances, the amplifier does not extend into the second device 80. For instance, FIG. 6B illustrates the system of FIG. 4 where the amplifier does not extend into the second device 80. As a result, the second device 80 does not include a secondary amplifier pit 98.

Figure 6C:
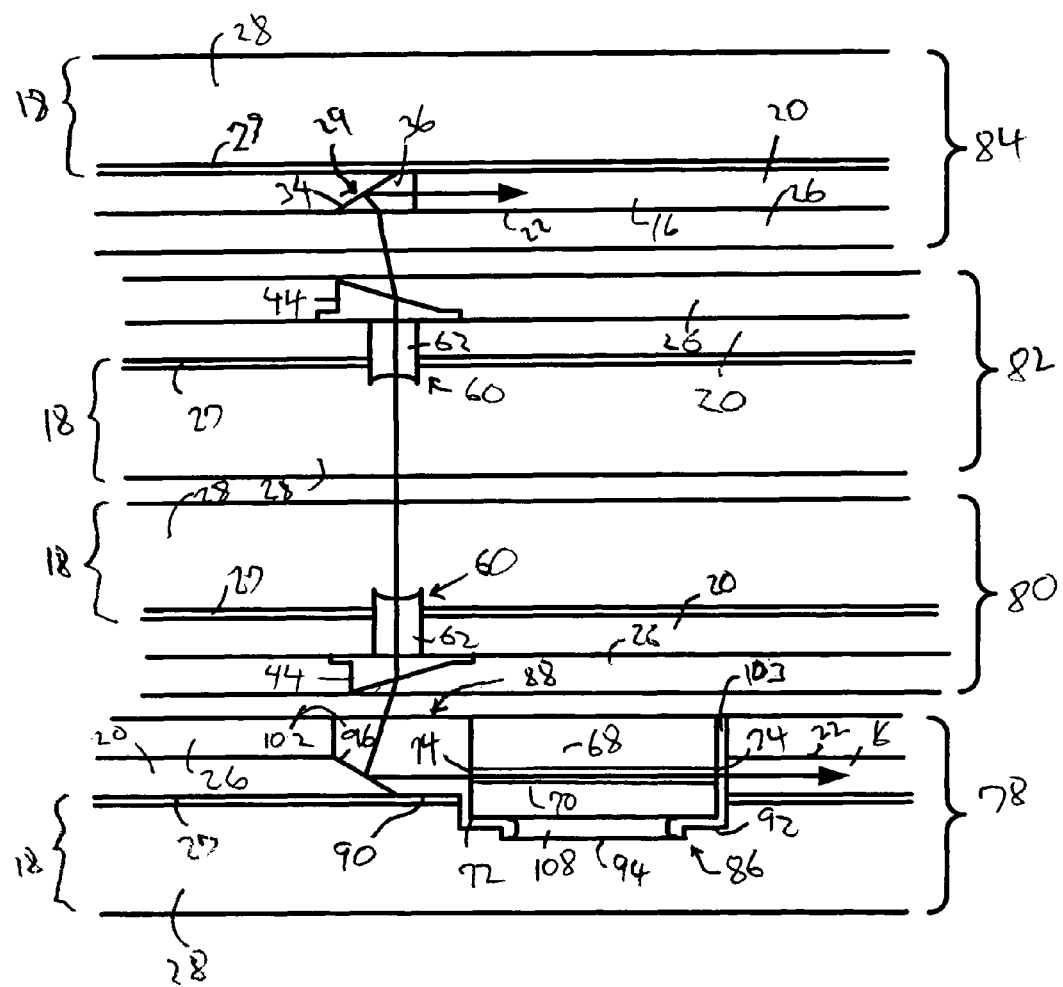
FIG. 6C is a cross section of an amplifier such as the amplifier of FIG. 5 incorporated into a system such as the system of FIG. 4. The system includes a device having a wedge optically aligned with a via. An interface between different media in the via extends across the optical path through the via and provides the via with both lens functionality but not functionality that changes a direction of a light signal traveling through the via. The wedge provides direction changing functionality.

Although FIG. 6A and FIG. 6B employ a second device 80 and a third device 82 having vias that combine the functions of a wedge and a lens, the second device 80 and/or the third device 82 can alternately employ a wedge optically aligned with a via having a lens function. For instance, FIG. 6C illustrates the system of FIG. 6B where both the second device 80 and the third device 82 have a wedge optically aligned with a via. The wedge 44 in the second device 80 is configured such that a light signal that travels from the first device 78 and then through the wedge 44 enters the via in the second device 80 traveling in a direction that is substantially perpendicular to the plane of the second device 80 and/or such that the light signal exits from the second device 80 traveling in a direction that is substantially perpendicular to the plane of the second device 80. The wedge 44 in the third device 82 is configured such that a light signal that travels from the fourth device 84 and then through the wedge 44 enters the via in the third device 82 traveling in a direction that is substantially perpendicular to the plane of the third device 82 and/or such that the light signal exits from the third device 82 traveling in a direction that is substantially perpendicular to the plane of the third device 82.

The wedge 44 employed in the second device 80 and the third device 82 of FIG. 6C provide the direction changing functionality of the interfaces in the second device 80 and the third device 82 of FIG. 6A. As a result, the presence of the wedge 44 in the second device 80 allow the non-45° surfaces that result from wet-etching crystalline materials to be employed as the reflecting side 96 in the amplifier port 88, or to act a support for the reflecting side 96 in the amplifier port 88, or partially define the reflecting side 96 in the amplifier port 88. Additionally or alternately, the presence of the wedge 44 in the third device 82 allow the non-45° surfaces that result from wet-etching crystalline materials to be employed as the reflecting side 34 in a port or to act a support for the reflecting side 34 in a port, or partially define the reflecting side 34 in a port.

Although the wedges 44 of FIG. 6C are illustrated as being a planar wedges, one or more of the wedges 44 can include some lens functionality. For instance, one or more wedges can have a curved side as disclosed in the context of FIG. 2E.

Figure 7:
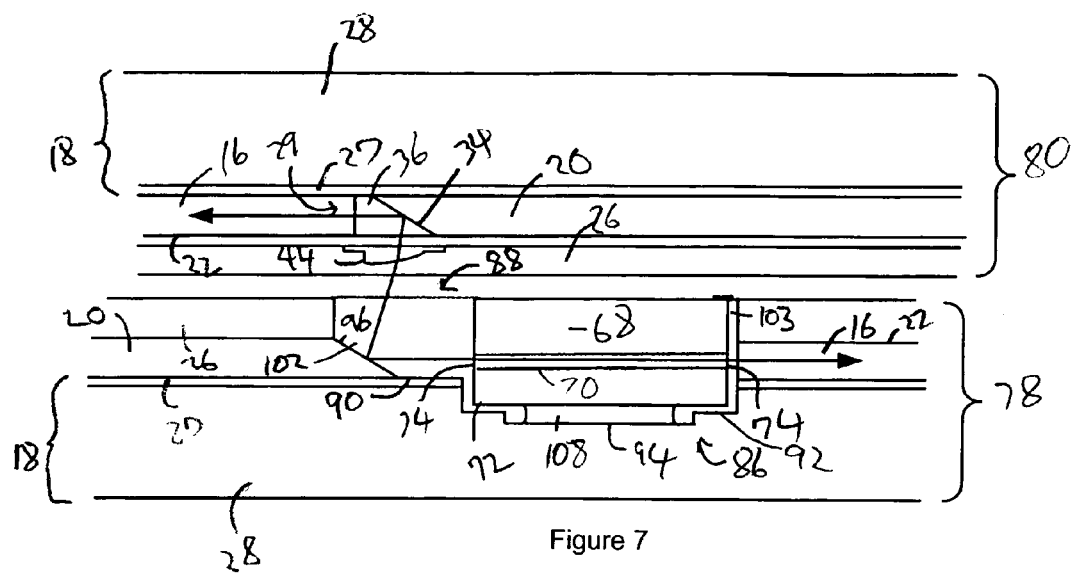
FIG. 7 is a cross section of an amplifier such as the amplifier of FIG. 5 incorporated into a system such as the system of FIG. 4. The system includes a device having a wedge optically aligned with a port. The wedge and the port each have direction changing functionality. The wedge also has lens functionality.

FIG. 7 is a cross section of an amplifier such as the amplifier of FIG. 5 incorporated into a system such as the system of FIG. 4. The system includes a first device 78 and a second device 80, a third device 82, and a fourth device 84. The first device 78 can be the same as the first device 78 disclosed in the context of FIG. 6A through FIG. 6C. The second device 80 includes a wedge 44 optically aligned with a port.

The second device 80 is aligned with the first device 78 such that a light signal that exits from the amplifier and is then reflected off the reflecting side 96 in the amplifier port 88 travels through the wedge 44 and then through the port on the second device 80 into a waveguide 16 on the second device 80. Because the reflecting side 96 in the amplifier port 88 is not at a 45° angle, the light signal is incident on the second device 80 at an angle that is non-perpendicular to the plane of the second device 80. The wedge 44 is configured to correct the direction of the light signal such that light signal is reflected off the reflecting side 34 in the port in traveling in a direction that allows the light signal to enter the waveguide 16 traveling in a direction that is substantially parallel to the axis of the waveguide 16 (parallel to the direction of propagation of light signals through the waveguide). Additionally, in some instances, the wedge 44 has lens functionality. For instance, the wedge 44 can be constructed according to FIG. 2E. As a result, the wedge 44 can focus or collimate the light signal in order to correct for diffraction or signal spreading than can occur as the light signal travels through the free-space regions between the amplifier and the waveguide 16 on the second device 80. For instance, the wedge 44 can correct for diffraction or signal spreading that occurs in the free space of the amplifier port 88 and between devices.

Figure 8:
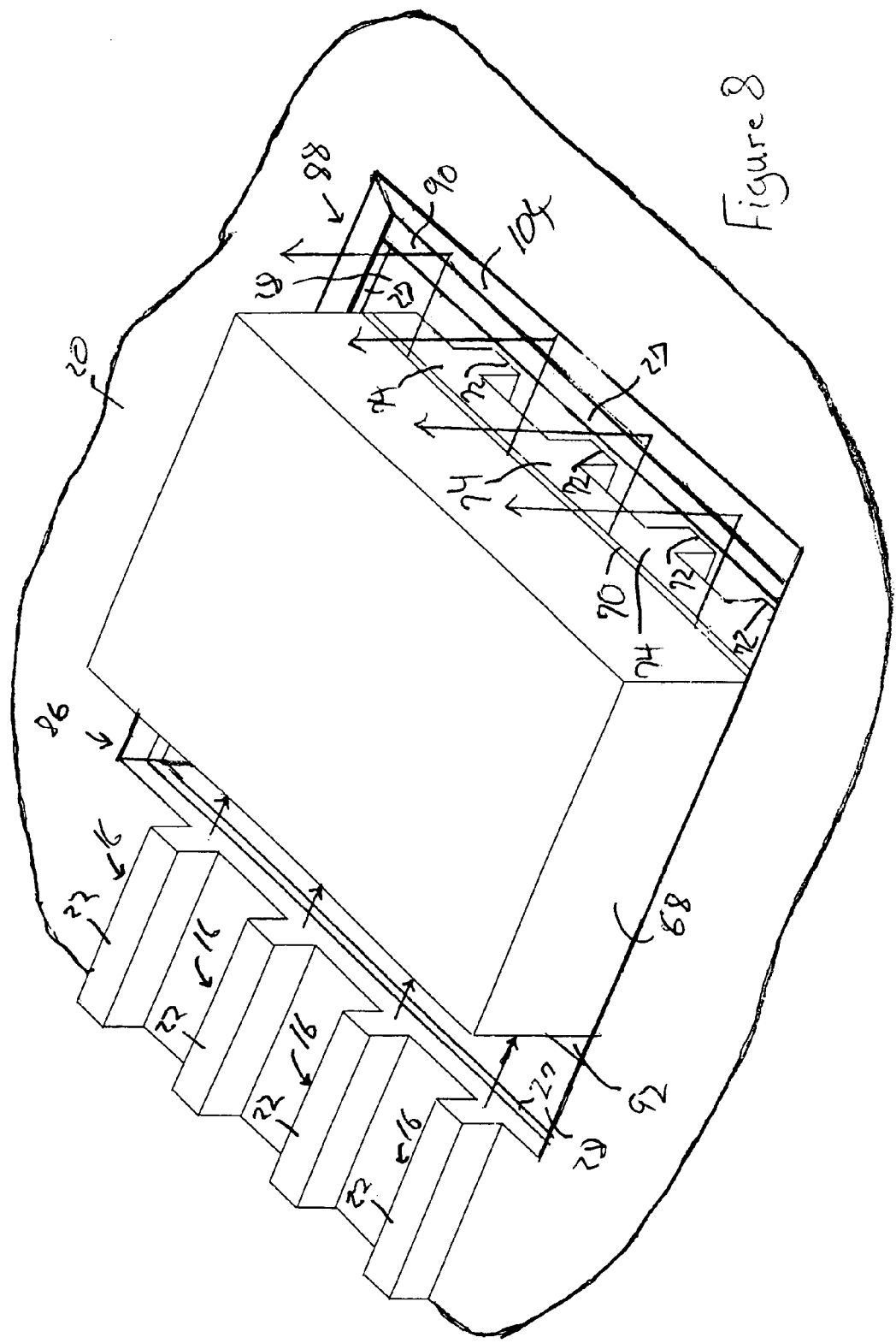
FIG. 8 is a perspective view of a device having several amplifiers. The amplifiers are defined in a single gain medium. The device of FIG. 8 is suitable for use as a device in any of the systems illustrated in FIG. 6A through FIG. 7.

Although FIG. 6A through FIG. 7 disclose a single amplifier incorporated into a device in a system. The system can include multiple amplifiers on the same device or on different devices. In some instances, one or more of the devices includes several amplifiers or an array of amplifiers. For instance, FIG. 8 is a perspective view of a device having several amplifiers. The amplifiers are defined in a single gain medium 68. The device of FIG. 8 is suitable for use as the first device 78 in any of the systems illustrated in FIG. 6A through FIG. 7. In order to simplify the illustration, the electrical connections for the amplifier are not illustrated.

In FIG. 8, the device includes a plurality of waveguides 16. Each waveguide 16 is partially defined by a ridge 22 extending from the first light-transmitting medium 20. Each of the amplifiers in the gain medium 68 is also partially defined by a ridge 72 extending from the gain medium 68. The gain medium 68 is positioned in the amplifier pit 86 such that the ridges 72 on the gain medium 68 are positioned in the amplifier pit 86. Accordingly, the ridges 72 that partially define each amplifier extend in an opposite direction from the ridges 22 that partially defines the waveguides 16. Additionally, each amplifier is optically aligned with one of the waveguides 16 such that each amplifier receives a light signal from an associated waveguide 16.

The device also includes a common reflecting side 104. The amplifiers are optically positioned between the waveguides 16 and the common reflecting side 104. As a result, each amplifier receives a light signal from an associated waveguide 16. The light signal travels through the amplifier where they are amplified and are then reflected off the common reflecting side 104. The reflected light signals can then be routed to different locations in the system using the constructions disclosed in the context of FIG. 6A through FIG. 7.

FIG. 9A through FIG. 9F illustrate a suitable method for forming a device that has an amplifier and is suitable for integrating into a system of stacked optical devices. For instance, the illustrated method is suitable for forming the first device 78 disclosed in the context of FIG. 6A through FIG. 7. While the method is shown executed on a silicon-on-insulator wafer, the method can be employed in conjunction with other optical platforms.

Figure 9A:
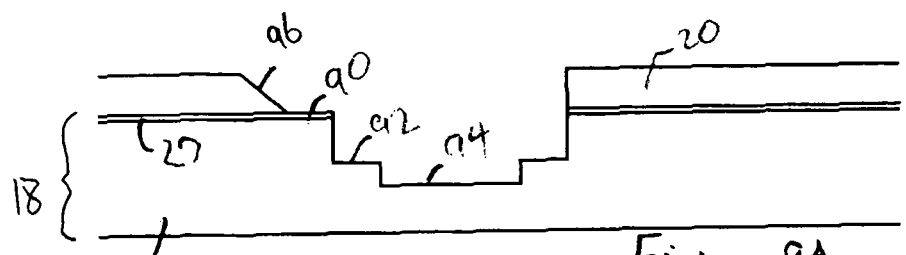
FIG. 9A through FIG. 9F illustrate a suitable method for incorporating an amplifier into an optical device that is suitable for use with a system constructed according to FIG. 4.

Several mask and etch steps can be employed to form waveguides and the amplifier pit 86 in a wafer as shown in FIG. 9A. Suitable masks include, but are not limited to, masks formed through the use of photolithigraphy. The primary recess 90, the secondary recess 92, and/or the tertiary recess 94 can be formed through the use of dry etching. The reflecting side 96 can be formed by performing a wet etch. When the wafer is a silicon-on-insulator wafer, the first light-transmitting medium 20 is silicon. As a result, the wet etch can provide the reflecting side 96 with an angle of around 54.7°.

Figure 9B:
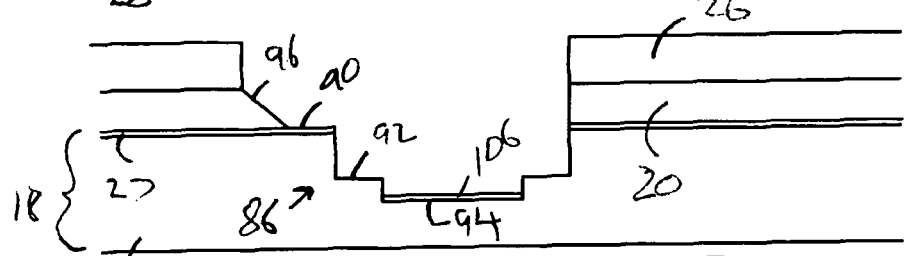

An electrical contact 106 can be formed in the bottom of the tertiary recess 94 as shown in FIG. 9B. The electrical contact 106 and electrical conductors for carrying electrical current to and/or from the electrical contact 106 can be formed by sputtering or evaporative deposition of conducting films. Additionally, the fourth light-transmitting medium 26 can be deposited on the first light-transmitting medium 20 at this time or at a later time.

Figure 9C:
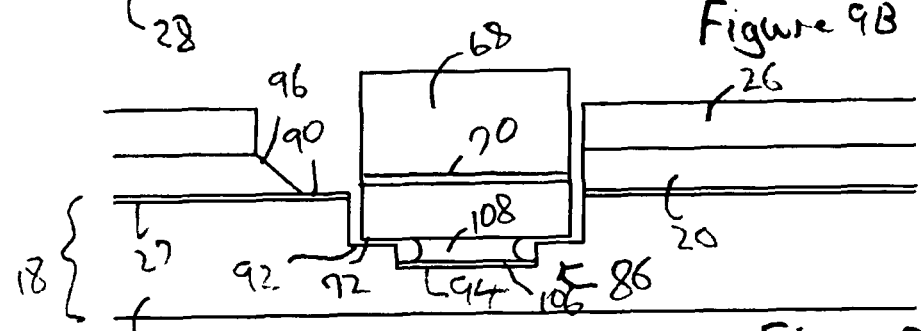
Figure 9D:
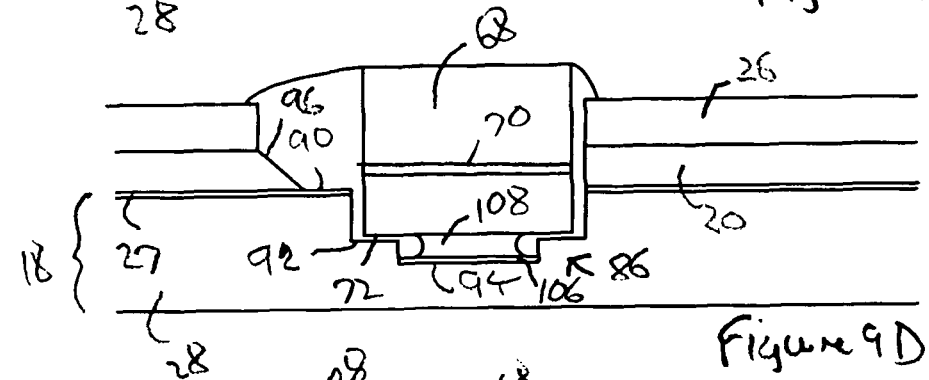

The amplifier can be placed in the amplifier pit 86 as illustrated in FIG. 9C. A suitable technique for placement of the amplifier includes using an electrically conducting material 108 between the amplifier and the electrical contact 106 in order to immobilize the amplifier in the amplifier pit 86. The electrically conducting material 108 carries electrical energy from the electrical contact 106 to the amplifier. Suitable electrically conducting materials 108 include, but are not limited to, solder.

A precursor for the eighth light-transmitting medium 102 and/or the ninth light-transmitting medium 103 is positioned in the amplifier pit 86. In particular, the eighth light-transmitting medium 102 and/or the ninth light-transmitting medium 103 are positioned between a facet 74 of the amplifier and the reflecting side 96 and between a facet 74 of the amplifier and waveguide. In some instances, the precursor for the eighth light-transmitting medium 102 and the ninth light-transmitting medium 103 are the same. The precursor(s) are cured to provide the device of FIG. 9D. In some instances, the eighth light-transmitting medium 102 and/or the ninth light-transmitting medium 103 come to a level above the fourth light-transmitting medium 26 as is evident in FIG. 9D.

Figure 9E:
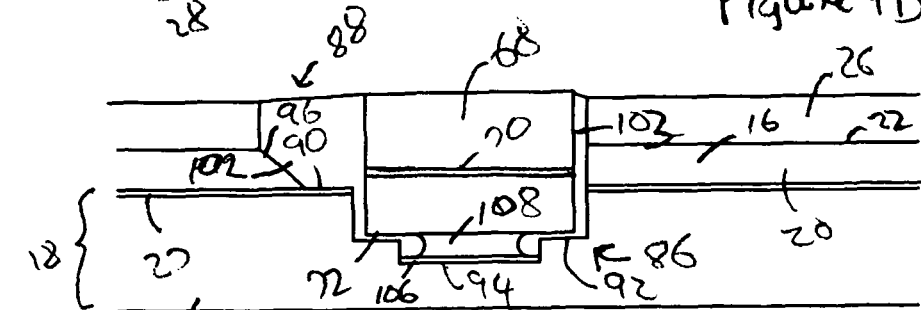

A portion of the amplifier is removed to provide the device of FIG. 9E. For instance, mechanical lapping and/or chemical mechanical polishing (CMP) can be used to remove all or a portion of the amplifier that is extending out of the amplifier pit 86. The portion of the amplifier that is removed provides an upper surface that is substantially parallel to the plane of the device. Removing the portion of the amplifier reduces the need for the secondary amplifier pit 98 or can reduce the depth needed for the secondary amplifier pit 98.

Figure 9F:
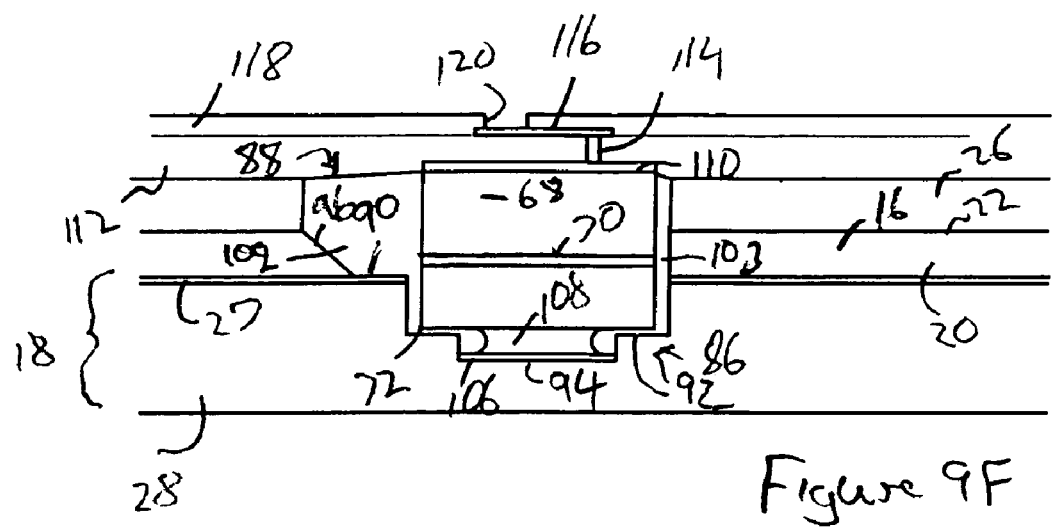

An electrical contact 110 can be formed on the upper side of the amplifier to provide the device of FIG. 9F. Additional mask and deposition steps can be performed to provide additional electrical connections on the amplifier. For instance, a cladding layer 112 can be formed over the electrical contact 110 and an electrical interconnect 114 deposited in an opening through the cladding layer 112. A second electrical contact 116 can be formed in electrical communication with the electrical interconnect 114. A second cladding layer 118 can be formed over the second electrical contact 116. An opening through the second cladding layer 118 can be created to provide access to the second electrical contact 116. Suitable materials for the cladding layer include, but are not limited to, silica, silicon nitride, polyimide.

Although the method of FIG. 9A through FIG. 9F describe the waveguides being formed before the amplifier pit, the waveguides can be formed after the amplifier pit or in conjunction with the amplifier pit.

Additional details about the device and system construction and fabrication can be found in U.S. patent application Ser. No. 11/985,065, filed on Nov. 13, 2007, entitled "System Employing Optical Devices with Optical Vias," and incorporated herein in its entirety.

In some instances, the above discussion expresses light signal direction as being substantially perpendicular to an entity such as plane. In some instances, a light signal is substantially perpendicular to the entity when the angle of the light signal relative to the entity is 90° or in a range of 88-92°, 89-91°, or 89.5-90.5°. In some instances, the above discussion expresses light signal direction as being substantially parallel to an entity such as an axis or direction of propagation. In some instances, a light signal is substantially parallel to the entity when the angle of the light signal relative to the entity is 0° or in a range of (−2°)-2°, (−1°)-1°, or (−0.5°)-0.5°.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical system, comprising:
   optical devices that each have functional sides between lateral sides, the functional sides including a top side and a bottom side,
   a first one of the devices having an optical amplifier, a first waveguide, and a first port,
   a second one of the devices having a second port optically aligned with a second waveguide,
   the second device being positioned over one of the functional sides of the first device,
   the optical amplifier optically positioned between the first waveguide and the first port such that a light signal from the first waveguide enters the amplifier and travels through the amplifier,
   the first port being configured to receive the light signal from the optical amplifier and change a direction that the light signal is traveling such that the light signal exits the first device traveling in a direction that is toward the second device,
   the second port configured to receive the light signal after the light signal exits the first device and to change a direction that the light signal is traveling such that the light signal enters the second waveguide.

2. The system of claim 1, wherein the first port includes a first reflecting side configured to receive the light signal from the amplifier and reflect the light signal in a direction toward the second device.

3. The system of claim 2, wherein the first reflecting side partially defines an amplifier pit in the first device, at least a portion of the amplifier being positioned in the amplifier pit.

4. The system of claim 2, wherein the first reflecting side is not positioned at 45° relative to a plane of the first device wherein the plane of the first device is defined by a bottom side of the first device.

5. The system of claim 1, wherein the optical devices include one or more additional optical devices, the one or more additional optical device being positioned between the first device and the second device, the one or more additional optical devices each including an optical via that defines an optical path that extends from the top side of the device to the bottom side of the device,
   the via in each of the one or more additional optical devices being aligned with the first device and the second device such that the light signal travels through the via in each of the one or more additional optical devices when traveling from the first port to the second port.

6. The system of claim 5, wherein the optical path defined by at least one of the vias crosses an interface between multiple light transmitting media, the interface being shaped so as to change a direction of the light signal as the light signal travels through the via and to focus the light signal or to collimate the light signal.

7. The system of claim 5, wherein the optical path defined by at least one of the vias crosses an interface between different light transmitting media, the interface being shaped so as to change a direction of the light signal as the light signal travels through the via and to focus the light signal or to collimate the light signal.

8. The system of claim 5, wherein at least one of the additional optical devices includes a wedge optically aligned with the via on that device,
   the wedge being positioned between the first device and the via on that device such that when the light signal travels from the first port to the second port, the light signal that travels through the wedge and then the via on that device,
   the wedge being configured to change a direction in which the light signal is traveling such that the light signal enters the via in that device traveling in a direction that is substantially perpendicular to the plane of that device.

9. The system of claim 5, wherein at least one of the additional optical devices includes a wedge optically aligned with the via on that device,
   the wedge being positioned between the second device and the via on that device such that when the light signal travels from the first port to the second port, the light signal that travels through the via on that device and then the wedge,
   the wedge being configured to change a direction in which the light signal is traveling such that the light signal enters the second waveguide traveling in a direction that is parallel to the axis of the second waveguide.

10. The system of claim 1, wherein the second device includes a wedge optically aligned with the port such that when the light signal travels from the first port to the second port, the light signal that travels through the wedge and then the second port,
    the wedge being configured to change the direction of the light signal such that light signal enters the second waveguide traveling in a direction that is substantially parallel to the axis of the second waveguide.

11. The system of claim 10, wherein the wedge is also configured to focus the light signal.

12. An optical system, comprising:
    optical devices that each have functional sides between lateral sides, the functional sides including a top side and a bottom side,
    a first one of the devices having an optical amplifier, a first waveguide, and a first port,
    a second one of the devices having a second port optically aligned with a second waveguide,
    the second device being positioned over one of the functional sides of the first device,
    the second port being configured to receive the light signal from the second waveguide and change a direction that the light signal is traveling such that the light signal exits the second device traveling in a direction that is toward the first device, the first port configured to receive the light signal after the light signal exits the second device and to change a direction that the light signal is traveling such that the light signal enters the amplifier, the optical amplifier being optically positioned between the first waveguide and the first port such that the light signal entering the amplifier from the first port travels through the amplifier and enters the first waveguide.

13. The system of claim 12, wherein the first port includes a first reflecting side configured to receive the light signal from the second device and reflect the light signal in a direction toward the amplifier.

14. The system of claim 13, wherein the first reflecting side partially defines an amplifier pit in the first device, at least a portion of the amplifier being positioned in the amplifier pit.

15. The system of claim 13, wherein the first reflecting side is not positioned at 45° relative to a plane of the first device wherein the plane of the first device is defined by the bottom side of the first device.

16. The system of claim 12, wherein the optical devices include one or more additional optical devices, the one or more additional optical device being positioned between the first device and the second device, the one or more additional optical devices each including an optical via that defines an optical path extending from the top side of the device to the bottom side of the device, the via in each of the one or more additional optical devices being aligned with the first device and the second device such that the light signal travels through the via in each of the one or more additional optical devices when traveling from the second port to the first port.

17. The system of claim 16, wherein the optical path defined by at least one of the vias crosses an interface between multiple light transmitting media, the interface being shaped so as to change a direction of the light signal as the light signal travels through the via and to focus the light signal or to collimate the light signal.

18. The system of claim 16, wherein the optical path defined by at least one of the vias crosses an interface between different light transmitting media, the interface being shaped so as to change a direction of the light signal as the light signal travels through the via and to focus the light signal or to collimate the light signal.

19. The system of claim 16, wherein at least one of the additional optical devices includes a wedge optically aligned with the via on that device, the wedge being positioned between the first device and the via on the at least one additional optical device such that when the light signal travels from the second port to the first port, the light signal that travels through the via and then the wedge on the at least one additional optical device, the wedge being configured to change a direction in which the light signal is traveling such that the light signal enters the first waveguide traveling in a direction that is parallel to the axis of the first waveguide.

20. The system of claim 16, wherein at least one of the additional optical devices includes a wedge optically aligned with the via on that device, the wedge being positioned between the second device and the via on that device such that when the light signal travels from the second port to the first port, the light signal that travels through the wedge on that device and then the port, the wedge being configured to change a direction in which the light signal is traveling such that the light signal enters the via in that device traveling in a direction that is substantially perpendicular to the plane of that device.

21. The system of claim 16, wherein the second device includes a wedge optically aligned with the port such that when the light signal travels from the second port to the first port, the light signal that travels through the second port and then the wedge, the wedge being configured to change the direction of the light signal such that the light signal enters the amplifier traveling in a direction that is substantially parallel to a plane of the first device wherein the plane of the first device is defined by the bottom side of the first device.

22. An optical system, comprising:

optical devices that each have a top side and a bottom side between lateral sides, the optical devices stacked such that a first one of the optical devices is positioned between the bottom side of a second one of the devices and the top side of a third one of the optical devices;

the second device having one or more second waveguides immobilized on a base; and the third device having one or more third waveguides immobilized on a base;

the first device having a via that defines an optical path that extends from the top side of the first device to the bottom side of the first device, the first device being positioned such that a light signal traveling between one of the second waveguides and one of the third waveguides travels through the via, the optical path defined by the via crosses an interface between multiple light transmitting media, the interface being shaped so as to change a direction of the light signal as the light signal travels through the via and to focus the light signal as the light signal travels through the via.

23. The system of claim 22, wherein the first device includes one or more first waveguides.

24. An optical system, comprising:

optical devices that each have a top side and a bottom side between lateral sides, the optical devices stacked such that a first one of the optical devices is positioned between the bottom side of a second one of the devices and the top side of a third one of the optical devices;

the second device having one or more second waveguides immobilized on a base; and the third device having one or more third waveguides immobilized on a base;

the first device having a via and a wedge, the via defining an optical path that extends from the top side of the first device to the bottom side of the first device, the optical path defined by the via extending across the wedge, and the first device being positioned such that a light signal traveling between one of the second waveguides and one of the third waveguides travels through both the wedge and the via.

25. The system of claim 24, wherein the first device includes one or more first waveguides.

26. The system of claim 24, wherein the optical path defined by the via crosses an interface between multiple light transmitting media, the interface being shaped so as to focus the light signal as the light signal travels through the via.

27. An optical system, comprising:
optical devices that each have functional sides between lateral sides, the functional sides including a top side and a bottom side,
- a first one of the devices having a first wedge, a first waveguide, and a first port,
- a second one of the devices having a second waveguide,
- the second device being positioned over one of the functional sides of the first device,
- the first device and the second device being arranged such that a light signal traveling between the first waveguide and the second waveguide travels through the first wedge and the first port with the first wedge and the first port being optically between the first waveguide and the second waveguide,
- the first device and the second device being arranged such that the light signal approaches or exits the second device at a non-perpendicular angle relative to a plane of the second device,
- the wedge being configured such that the light signal traveling through the wedge causes a direction of propagation of the light signal through the first device to change between a direction that is non-perpendicular relative to the plane of the second device and a direction that is perpendicular relative to the plane of the second device, and
- the first port including a reflecting side configured to reflect the light signal as the light signal travels through the first port.

28. A method of forming an optical device, comprising:
placing an amplifier in a pit on an optical device,
removing a portion of the amplifier after placing the amplifier in the pit, and
configuring the device such that the pit is positioned between a waveguide on the device and a port included in the pit, the port having a reflecting surface configured to reflect a light signal traveling through the port.

29. The system of claim 3, wherein a secondary pit is defined in the second optical device and the amplifier is also positioned in the secondary pit.

* * * * *